United States Patent
Ushikubo

(10) Patent No.: US 12,471,437 B2
(45) Date of Patent: Nov. 11, 2025

(54) DISPLAY DEVICE

(71) Applicant: Magnolia White Corporation, Tokyo (JP)

(72) Inventor: Takahiro Ushikubo, Tokyo (JP)

(73) Assignee: Magnolia White Corporation, Tokyo (JP)

(*) Notice: Subject to any disclaimer, the term of this patent is extended or adjusted under 35 U.S.C. 154(b) by 310 days.

(21) Appl. No.: 17/991,849

(22) Filed: Nov. 22, 2022

(65) Prior Publication Data
US 2023/0165034 A1    May 25, 2023

(30) Foreign Application Priority Data
Nov. 25, 2021 (JP) .................. 2021-191564

(51) Int. Cl.
*H10K 50/813* (2023.01)
*H10K 50/822* (2023.01)
*H10K 59/12* (2023.01)

(52) U.S. Cl.
CPC ......... *H10K 50/813* (2023.02); *H10K 50/822* (2023.02); *H10K 59/12* (2023.02)

(58) Field of Classification Search
CPC ............... H10K 50/813; H10K 50/822; H10K 50/15–157; H10K 50/16–167; H10K 59/12; H10K 59/771; H10K 59/35
See application file for complete search history.

(56) References Cited

U.S. PATENT DOCUMENTS

2018/0123068 A1* 5/2018 Ushikubo ............ H10K 50/852
2021/0399233 A1* 12/2021 Kim ..................... H10K 85/631

FOREIGN PATENT DOCUMENTS

JP    2011-9169 A    1/2011

* cited by examiner

*Primary Examiner* — Steven B Gauthier
*Assistant Examiner* — Adam D Weiland
(74) *Attorney, Agent, or Firm* — XSENSUS LLP

(57) ABSTRACT

A display device includes a first pixel electrode, a second pixel electrode, an insulating layer including a first opening part exposing a part of an upper surface of the first pixel electrode, and a second opening part exposing a part of an upper surface of the second pixel electrode, a first common layer arranged above the first pixel electrode, the second pixel electrode and the insulating layer, a first light-emitting layer a second light-emitting layer arranged above the first common layer; an opposite electrode arranged above the first light-emitting layer and the second light-emitting layer, a carrier absorption layer arranged above the insulating layer, the carrier absorption layer being arranged between the first common layer and the second light-emitting layer, and a light emission start voltage of the second light-emitting layer is lower than a light emission start voltage of the first light-emitting layer.

10 Claims, 21 Drawing Sheets

FIG. 14
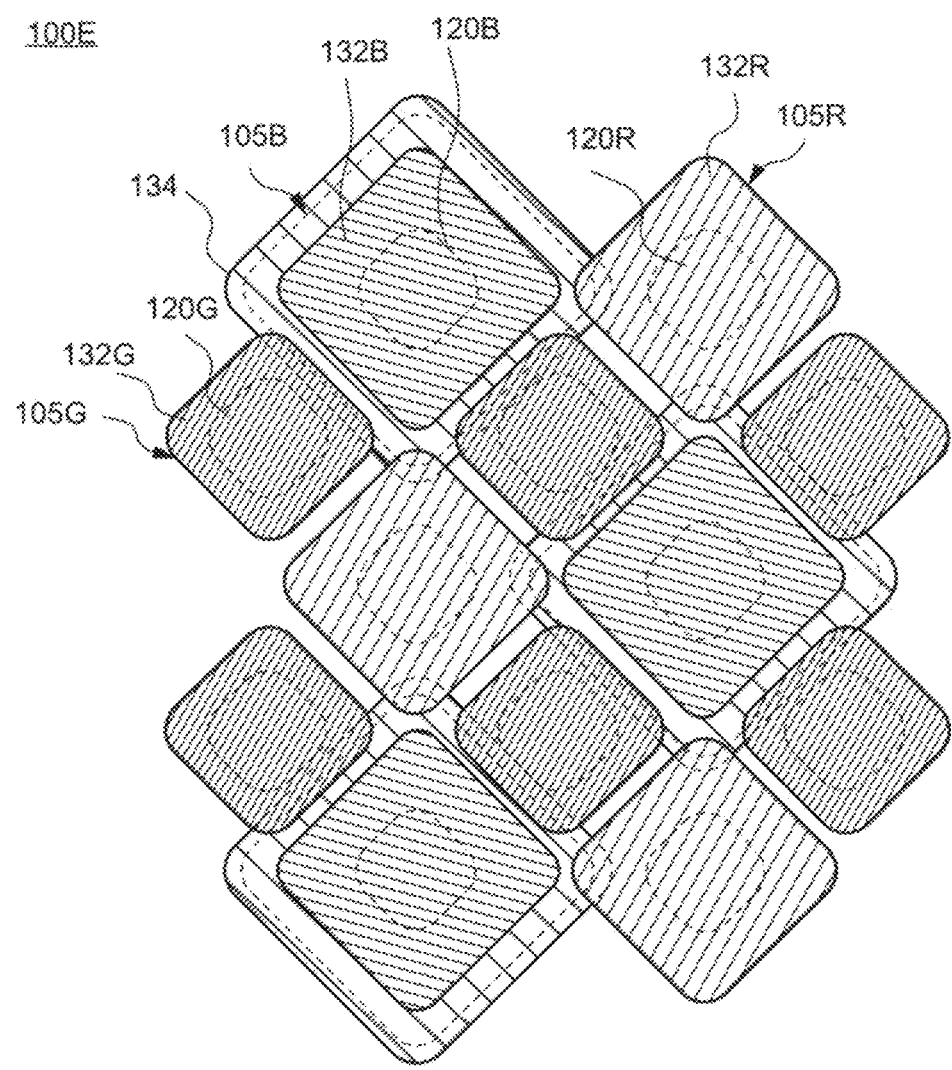
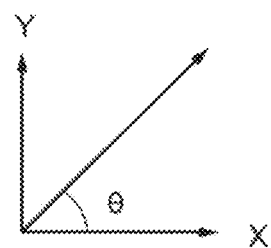

PRIOR ART

PRIOR ART

PRIOR ART

DISPLAY DEVICE

CROSS-REFERENCE TO RELATED APPLICATIONS

This application claims the benefit of priority to Japanese Patent Application No. 2021-191564, filed on Nov. 25, 2021, the entire contents of which are incorporated herein by reference.

FIELD

An embodiment of the present invention relates to a display device and a method for manufacturing the same.

BACKGROUND

Conventionally, an organic EL display device (Organic Electroluminescence Display) using an organic electroluminescent material (organic EL material) as a light-emitting element (organic EL element) of a display unit has been known as a display device. In recent years, there has been an increasing demand for higher definition in an organic EL display device.

As the definition of the EL display device is increased, adjacent pixels become closer together, and therefore, an effect of a leakage current flowing between adjacent pixels (hereinafter, also referred to as "leakage current in the transverse direction") is actualized. In the EL display device, the leakage current in the transverse direction may cause the adjacent pixels to emit light, thereby deteriorating the quality of the EL display device. For example, see Japanese laid-open patent publication No. 2011-009169.

SUMMARY

A display device according to an embodiment of the present invention includes a first pixel electrode, a second pixel electrode arranged separately from the first pixel electrode in a first direction, an insulating layer covering the first pixel electrode and the second pixel electrode, the insulating layer including a first opening part and a second opening part, the first opening part exposing at least a part of an upper surface of the first pixel electrode, and the second opening part exposing at least a part of an upper surface of the second pixel electrode, a first common layer arranged above the first pixel electrode, the second pixel electrode and the insulating layer, a first light-emitting layer arranged above the first common layer, and the first light-emitting layer arranged at a position overlapping the first pixel electrode, a second light-emitting layer arranged above the first common layer, and the first light-emitting layer arranged at a position overlapping the second pixel electrode; an opposite electrode arranged above the first light-emitting layer and the second light-emitting layer, a carrier absorption layer arranged above the insulating layer, the carrier absorption layer being arranged between the first common layer and the second light-emitting layer, and a light emission start voltage of the second light-emitting layer is lower than a light emission start voltage of the first light-emitting layer.

BRIEF DESCRIPTION OF DRAWINGS

FIG. 14 is an enlarged view of a pixel layout when a display device is in a plan view.

DESCRIPTION OF EMBODIMENTS

The present invention provides a display device in which a leakage current in a transverse direction in a light-emitting element is suppressed.

Hereinafter, embodiments of the present invention will be described with reference to the drawings and the like. However, the present invention can be implemented in various aspects without departing from the gist thereof and is not to be construed as being limited to the description of the embodiments exemplified below. In addition, in order to make the description clearer with respect to the drawings, the width, thickness, shape, and the like of each part may be schematically represented in comparison with actual embodiments, but the schematic drawings are merely examples, and do not limit the interpretation of the present invention. Further, in this specification and the drawings, the same or similar elements as those described with respect to the above-described drawings are denoted by the same symbols, and a redundant description may be omitted.

In the present invention, when a single film is processed to form a plurality of films, the plurality of films may have different functions and roles. However, the plurality of films derives from films formed as the same layer in the same process, and they have the same layer structure and the same material. Therefore, the plurality of films is defined as existing in the same layer.

Also, in this specification, expressions such as "upper" and "lower" in describing the drawings represent relative positional relationships between a structure of interest and other structures. In this specification, in a side view, the direction from an insulating surface to a light-emitting element, which will be described later, is defined as "upper", and a reverse direction thereof is defined as "lower". In this specification and the claims, the expression "on" in describing the manner of arranging another structure on a certain structure shall include both arranging another structure directly above a certain structure and arranging another structure above a certain structure via yet another structure, unless otherwise specified.

Figure 1:
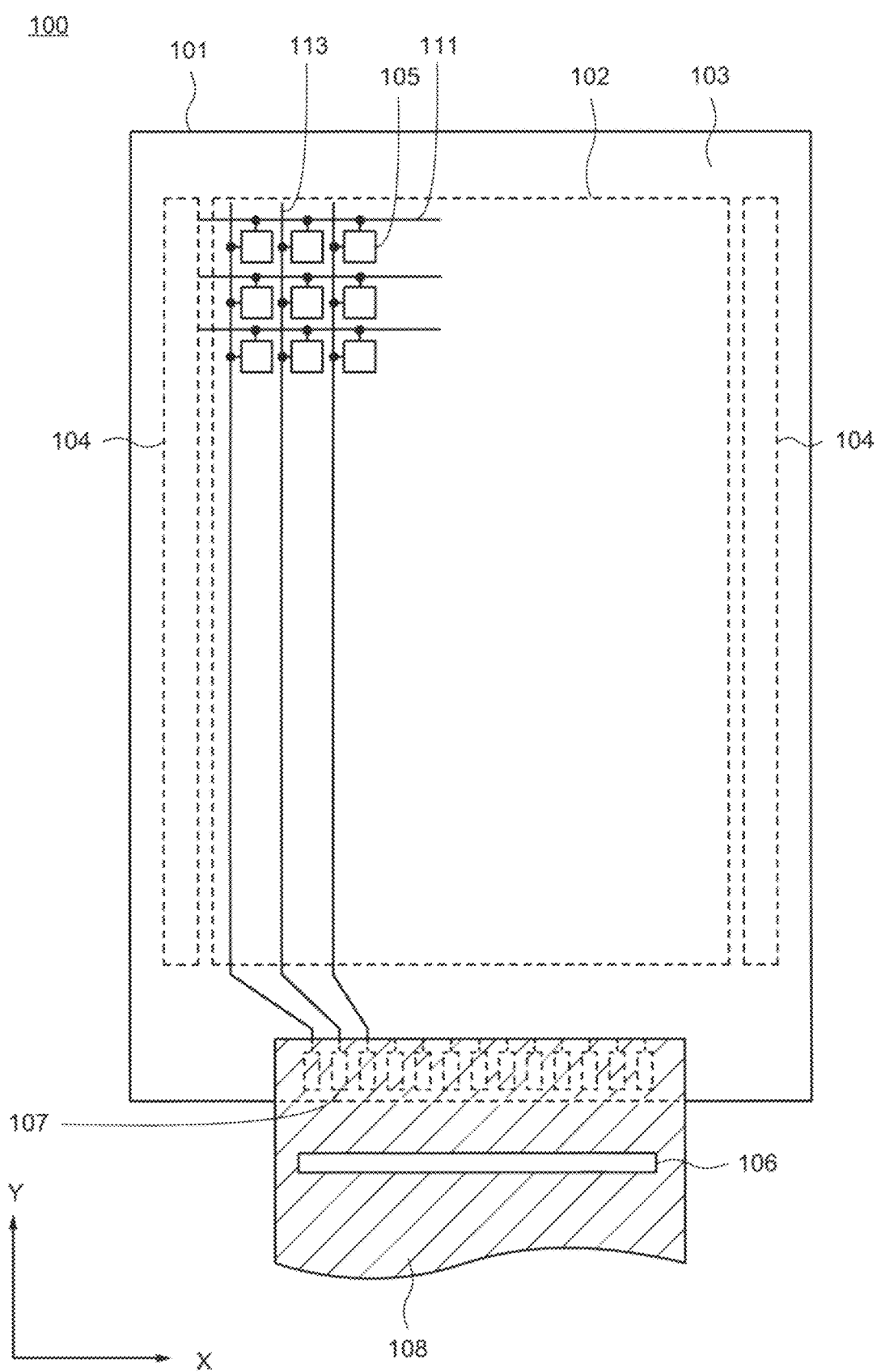
FIG. 1 is a schematic diagram when a display device according to an embodiment of the present invention is in a plan view.

A display device according to an embodiment of the present invention will be described with reference to FIG. 1 to FIG. 16. FIG. 1 is a schematic diagram showing a configuration of a display device 100 according to an embodiment of the present invention and shows a schematic configuration when the display device 100 is in a plan view. In this specification, a state in which the display device 100 is viewed perpendicularly to a screen (display area) is referred to as a "plan view."

As shown in FIG. 1, the display device 100 includes a display area 102 formed in an insulating surface, a scan line drive circuit 104, a driver IC 106, and a terminal part in which a plurality of terminals 107 is arranged. A light-emitting element having an organic layer composed of an organic material is arranged in the display area 102. In addition, a peripheral area 103 surrounds the display area 102. The driver IC 106 functions as a control unit that transmits a signal to the scan line drive circuit 104 and a data line drive circuit. The data line drive circuit may be arranged with a sampling switch or the like on a substrate 101 separately from the driver IC 106. In addition, although the driver IC 106 is arranged above a flexible printed circuit (Flexible Print Circuit: FPC) 108, the driver IC 106 may be arranged above the substrate 101). The flexible printed circuit 108 is connected to the plurality of terminals 107 arranged in the peripheral area 103.

In this case, the insulating surface is a surface of the substrate 101. The substrate 101 supports each layer, such as the insulating layer and the conductive layer, arranged above its surface. Also, the substrate 101 may be made of an insulating material, may have an insulating surface, or an insulating film may be separately formed on the substrate 101 to form an insulating surface. The material of the substrate 101 and the material for forming the insulating film are not particularly limited as long as the insulating surface can be obtained.

In the display area 102 shown in FIG. 1, a plurality of pixels 105 is arranged in a matrix in an X-direction and Y-direction. In this specification and the like, a pixel refers to the smallest unit that enables the desired color to be displayed in the display area 102. Each pixel 105 has a pixel circuit and a light-emitting element electrically connected to the pixel circuit. The light-emitting element includes a pixel electrode, an organic layer (light-emitting part) including a light-emitting layer stacked on the pixel electrode, and a counter electrode. The light-emitting elements included in the pixel 105 emit different colors from each other. For example, the pixel 105 emits a color of either a red light-emitting element, a green light-emitting element, or a blue light-emitting element. Also, the color emitted by the light-emitting element is not limited to the above three colors and may be at least one color. In this specification and the like, the component included in the red light-emitting element is indicated by R, the component included in the green light-emitting element is indicated by G, and the component included in the blue light-emitting element is indicated by B. In addition, an emission peak wavelength of the blue light-emitting element is 460 nm or more and 500 nm or less. An emission peak wavelength of the red light-emitting element is 610 nm or more and 780 nm or less. An emission peak wavelength of the green light-emitting element is 500 nm or more and 570 nm or less.

Each pixel 105 is electrically connected to a scan line 111 and a data line 113. Although not shown, the pixel 105 is electrically connected to a power supply line. The scan line 111 extends along the X-direction and is electrically connected to the scan line drive circuit 104. The data line 113 extends along the Y-direction and is electrically connected to the driver IC 106. In addition, the driver IC 106 outputs a scan signal to the scan line 111 via the scan line drive circuit 104. The driver IC 106 outputs a data signal corresponding to image data to the data line 113. Inputting the scan signal and the data signal to the pixel circuit included in each pixel 105 makes it possible to perform a screen display corresponding to the image data. The pixel circuit is composed of a plurality of transistors. Typically, a thin film transistor (TFT) can be used as the transistor. However, the present invention is not limited to the thin film transistor, and any element having a current control function may be used.

Figure 2:
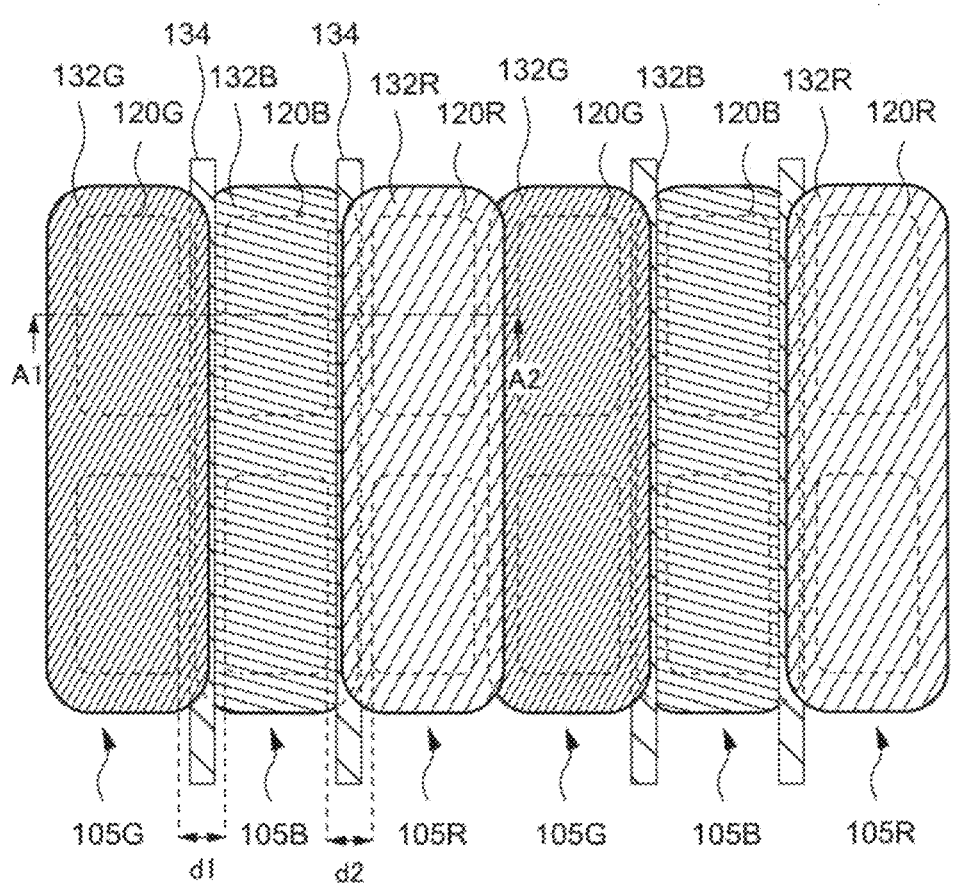
FIG. 2 is an enlarged view of a pixel layout when a display device is in a plan view.
Figure 3:
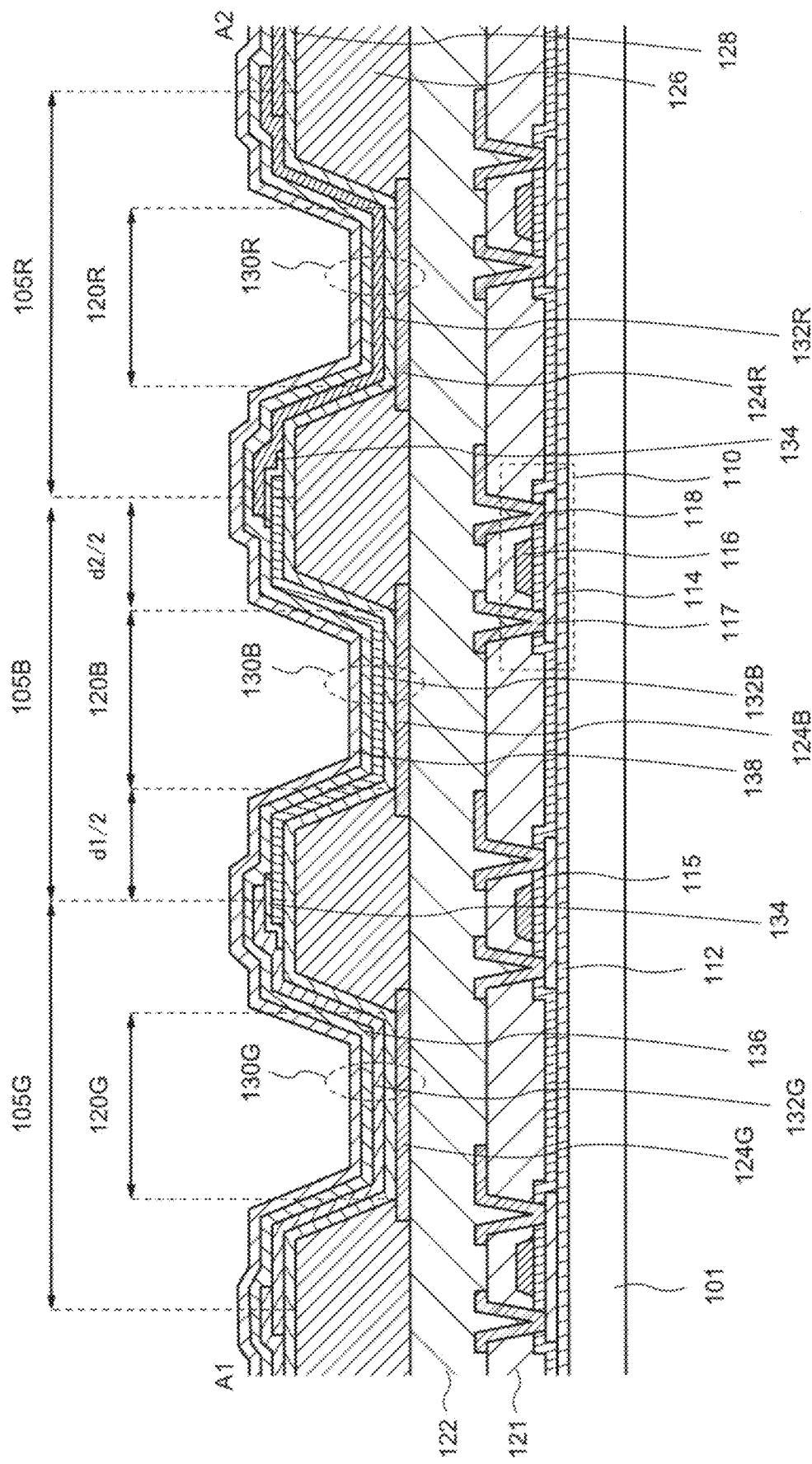
FIG. 3 is a cross-sectional view when a display device shown in FIG. 2 is cut along a line A1-A2.
Figure 4:
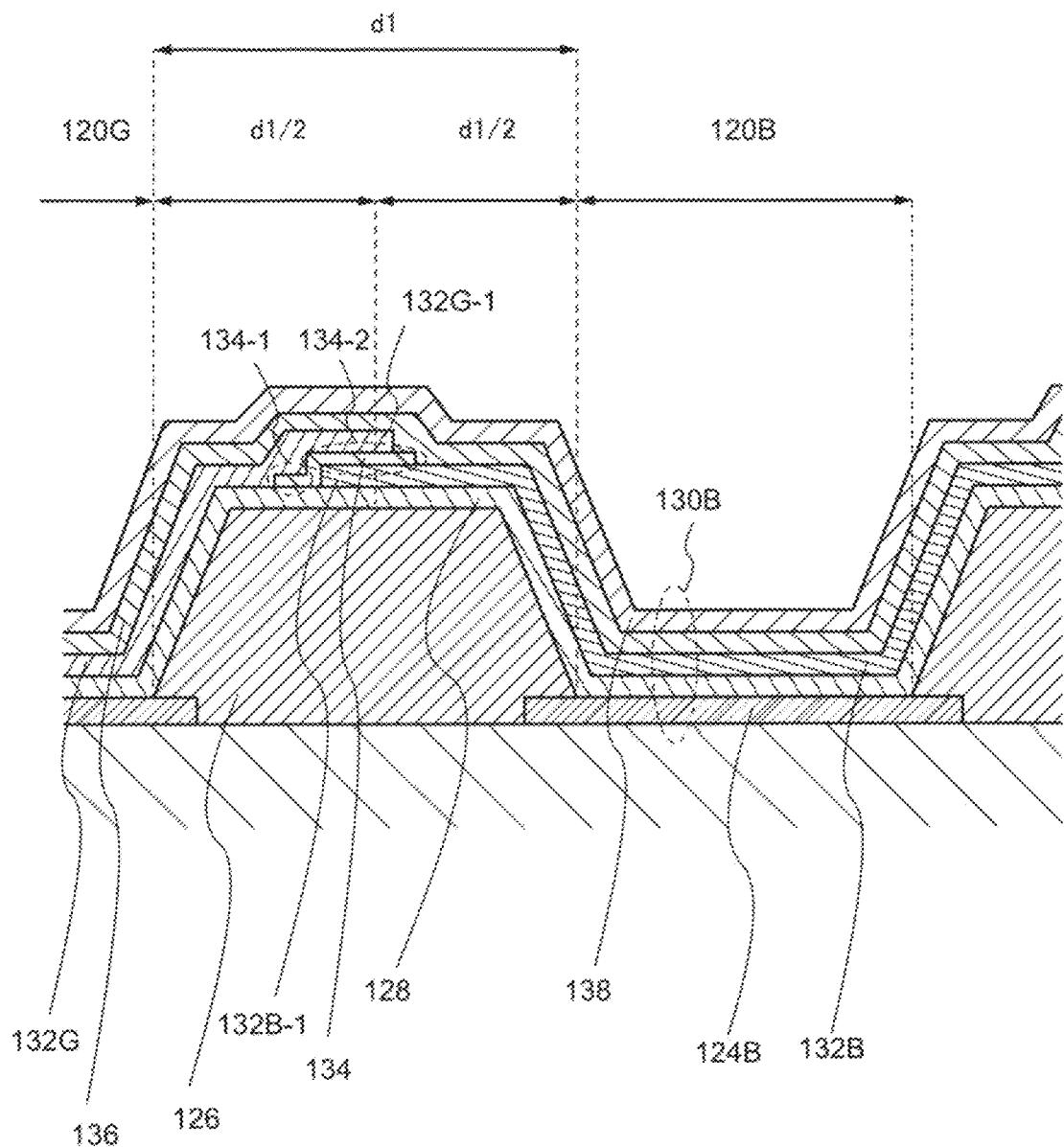
FIG. 4 is a partially enlarged view of the cross-sectional view shown in FIG. 3.

FIG. 2 is an enlarged view of a pixel layout when the display device 100 is in a plan view, and FIG. 3 is a cross-sectional view when the pixel layout shown in FIG. 2 is cut along a line A1-A2. FIG. 4 is a partially enlarged view of the cross-sectional view shown in FIG. 3. In the present embodiment, a configuration of a top-emission display device will be described.

FIG. 2 shows an area where pixels 105R, 105G, and 105B are arranged. The pixel 105R, the pixel 105G, and the pixel 105B are arranged side by side in the X-direction. In addition, the pixel 105R and the pixel 105R, the pixel 105G and the pixel 105G, and the pixel 105B and the pixel 105B are arranged side by side in the Y-direction. In FIG. 2, an area indicated by a solid line is an area where light-emitting layers 132R, 132G, and 132B are arranged. In addition, an area surrounded by a dotted line is an area where openings 120R, 120G, and 120B are arranged in the insulating layer. The insulating layer is also referred to as a barrier or bank. The openings 120R, 120G, and 120B arranged in the insulating layer correspond to a light-emitting area when light-emitting elements 130R, 130G, and 130B actually emit light. Also, if each of the light-emitting elements 130R, 130G, and 130B is not distinguished, they will be collectively described as the light-emitting element 130. In addition, the same applies to each component of the light-emitting elements 130R, 130G, and 130B.

FIG. 3 shows a cross-sectional view of the pixels 105R, 105G, and 105B.

A plurality of transistors 110 is arranged above the substrate 101 via an insulating film 112. The plurality of transistors 110 constitutes the pixel circuit. The transistor 110 is composed of at least a semiconductor layer 114, a gate insulating film 115, and a gate electrode 116. An interlayer insulating film 121 is arranged above the transistor 110. A source electrode or drain electrode 117 or 118 is arranged above the interlayer insulating film 121. Each of the source electrode or drain electrode 117 or 118 is connected to the semiconductor layer 114 via a contact hole arranged in the interlayer insulating film 121. An insulating film 122 is arranged above the interlayer insulating film 121. The insulating film 122 can relieve any unevenness caused by the transistor 110 and the source electrode or drain electrode 117 or 118. The plurality of transistors 110 arranged above the substrate 101, and the interlayer insulating film 121 and the insulating film 122 arranged above the transistor 110 are formed by known materials and methods. Also, the configuration of the pixel circuit arranged below the insulating film 122 is omitted after FIG. 4.

The light-emitting element 130R is arranged in the pixel 105R, the light-emitting element 130G is arranged in the pixel 105G, and the light-emitting element 130B is arranged in the pixel 105B on the insulating film 122. The light-emitting element 130R has at least a pixel electrode 124R, the light-emitting layer 132R, and a counter electrode 138. The light-emitting element 130G has at least a pixel electrode 124G, the light-emitting layer 132G, and the counter electrode 138. The light-emitting element 130B has at least a pixel electrode 124B, the light-emitting layer 132B, and the counter electrode 138. A common layer 128 is arranged between the pixel electrodes 124R, 124G, and 124B and the light-emitting layers 132R, 132G, and 132B. A common layer 136 is arranged between the light-emitting layers 132R, 132G, and 132B and the counter electrode 138. The common layers 128 and 136 are arranged in common over the light-emitting elements 130R, 130G, and 130B. In FIG. 3, the pixel electrodes 124R, 124G, and 124B are anodes and the counter electrode 138 is a cathode. The common layer 128 includes at least one of a hole transport layer and a hole injection layer, and the common layer 136 includes at least one of an electron transport layers and an electron injection layer. Although not shown in FIG. 3, each of the pixel electrodes 124R, 124G, and 124B is electrically connected to the transistor 110 included in the pixel circuit.

In the present embodiment, when the display device 100 is viewed in cross-section, a first end portion of the light-emitting layer 132B overlaps the light-emitting layer 132G. In addition, a second end portion of the light-emitting layer 132B overlaps the light-emitting layer 132R. In this case, a carrier absorption layer 134 is arranged at a position where the first end portion of the light-emitting layer 132B overlaps the light-emitting layer 132G and/or a position adjacent to the position where the first end portion of the light-emitting layer 132B overlaps the light-emitting layer 132G. In addition, the carrier absorption layer 134 is also arranged at a position where the second end portion of the light-emitting layer 132B overlaps the light-emitting layer 132R and/or the position adjacent to the position where the second end portion of the light-emitting layer 132B overlaps the light-emitting layer 132G. Also, the first end portion of the light-emitting layer 132B is preferably arranged so as to be close to the opening 120R of the light-emitting element 130G. In addition, the second end portion of the light-emitting layer 132B is preferably arranged so as to be close to the opening 120G of the light-emitting element 130G. Also, "an end portion of a light-emitting layer" in this specification and the like means an outer edge of the light-emitting layer when the display device 100 is in a plan view. In this specification and the like, the display device 100 is cut along a plane or a curved surface that intersects the insulating surface, and a state in which the cut surface is viewed from direction parallel to the screen is referred to as a "cross-sectional view."

As the definition of the EL display device increases, the pixel becomes closer to the pixel, and therefore, an effect of a leakage current in the transverse direction flowing between adjacent pixels increases. In the EL display device, the leakage current in the transverse direction may cause the light-emitting layer of the adjacent pixels to emit light, thereby deteriorating the quality of the EL display device.

Hereinafter, a mechanism of the leakage current in the transverse direction in the EL display device causing the light-emitting layer to emit light in an unintended area in adjacent pixels will be described with reference to FIG. 17 to FIG. 21. Also, configurations of pixel circuits arranged below an insulating film 222 are omitted in FIG. 17 to FIG. 21.

Figure 17:
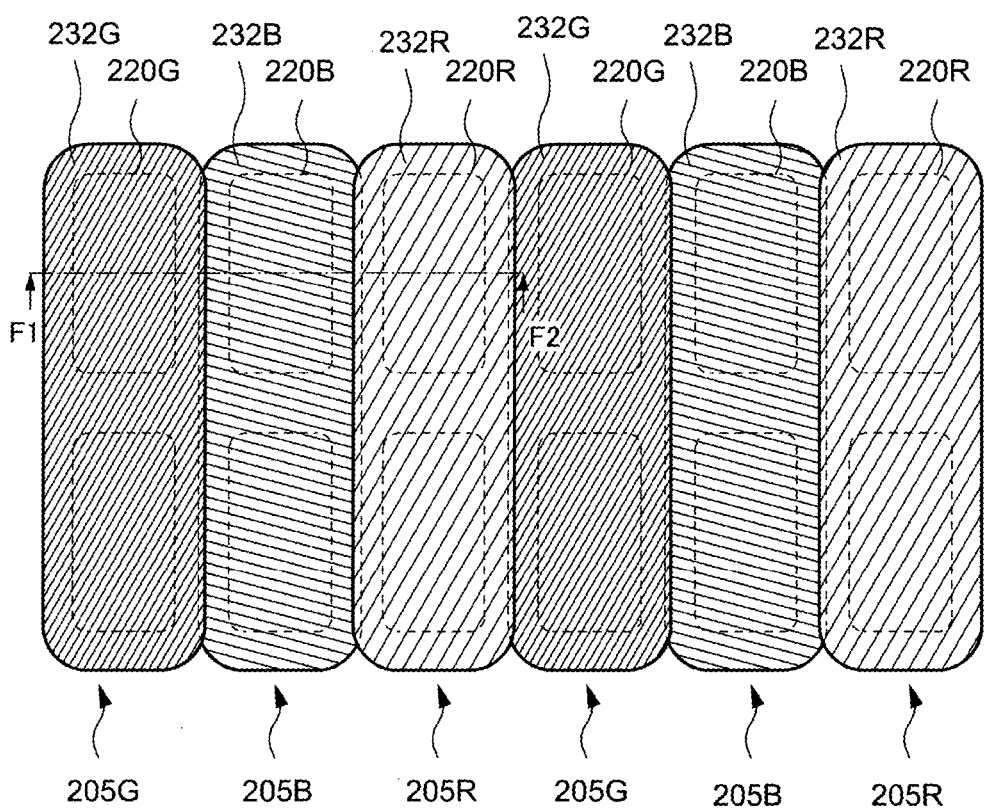
FIG. 17 is an enlarged view of a pixel layout when a conventional display area is in a plan view.
Figure 18:
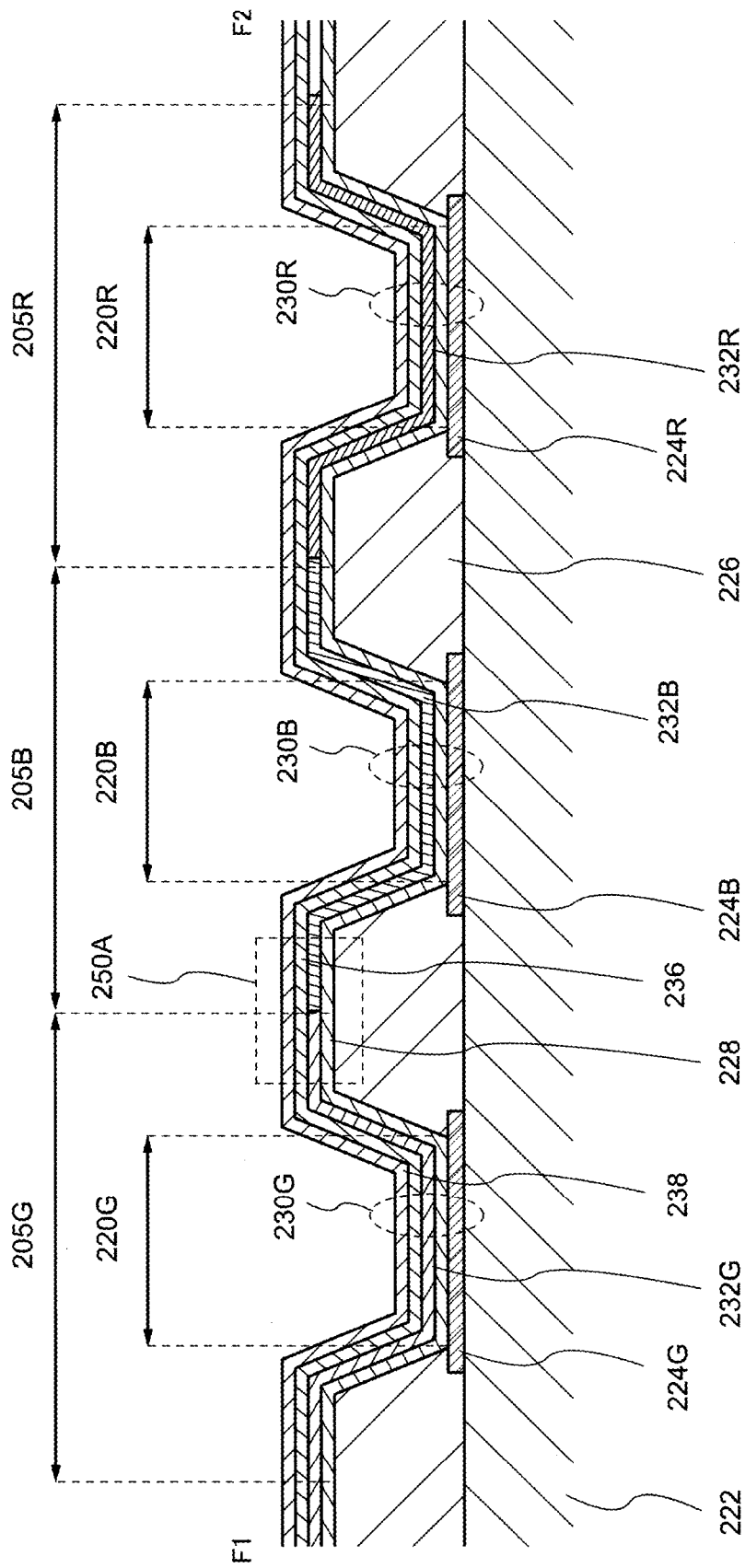
FIG. 18 is a cross-sectional view when a display area shown in FIG. 17 is cut along a line F1-F2.
Figure 19:
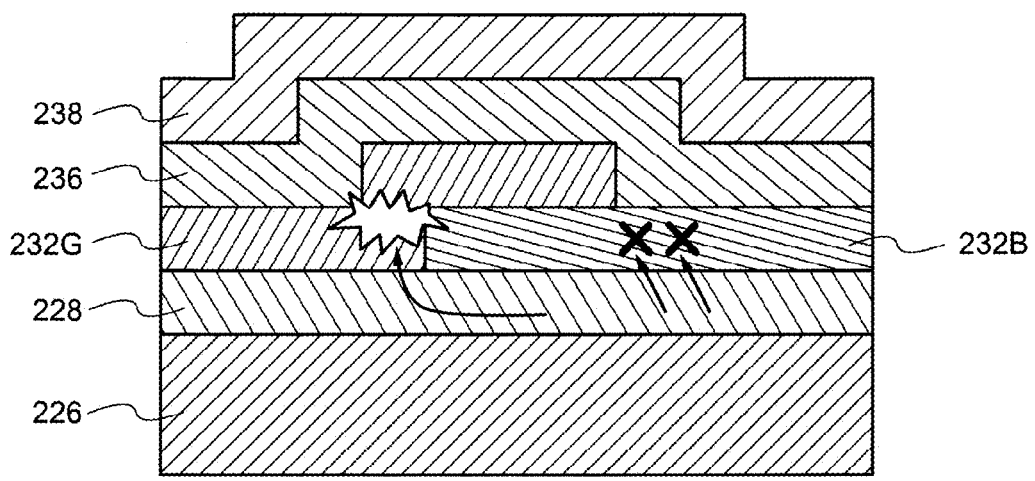
FIG. 19 is a partially enlarged view of the cross-sectional view shown in FIG. 18.

FIG. 17 is an enlarged view of a pixel layout when a conventional display device 200 is in a plan view, and FIG. 18 is a cross-sectional view when the display device 200 shown in FIG. 17 is cut along a line F1-F2. In addition, FIG. 19 is a partially enlarged view of the cross-sectional view shown in FIG. 18.

FIG. 17 shows an area where pixels 205R, 205G, and 205B are arranged. The pixel 205R, the pixel 205G, and the pixel 205B are arranged side by side in the X-direction. In addition, the pixel 205R and the pixel 205R, the pixel 205G and the pixel 205G, and the pixel 205B and the pixel 205B are arranged side by side in the Y-direction. In FIG. 17, an area indicated by a solid line is an area where light-emitting layers 232R, 232G, and 232B are arranged. In addition, an area surrounded by a dotted line is an area where openings 220R, 220G, and 220B of the insulating layer are arranged. The openings 220R, 220G, and 220B arranged in the insulating layer correspond to an emission area when light-emitting elements 230R, 230G, and 230B actually emit light. Also, if each of the light-emitting elements 230R, 230G, and 230B is not distinguished, they will be collectively described as the light-emitting element 230. In addition, the same applies to each component of the light-emitting elements 230R, 230G, and 230B.

As shown in FIG. 17, the light-emitting layer 232G and the light-emitting layer 232B partially overlap at a border area between the adjacent pixel 205G and pixel 205B. In addition, the light-emitting layer 232B and the light-emitting layer 232R partially overlap at a border area between the adjacent pixel 205B and pixel 205R.

FIG. 18 shows a cross-sectional view of the pixel 205R, 205G, and 205B. The light-emitting element 230R is arranged in the pixel 205R, the light-emitting element 230G is arranged in the pixel 205G, and the light-emitting element 230B is arranged in the pixel 205B on the insulating film 222. The light-emitting element 230R has at least a pixel electrode 224R, the light-emitting layer 232R, and the counter electrode 238. The light-emitting element 230G has at least a pixel electrode 224G, the light-emitting layer 232G, and the counter electrode 238. The light-emitting element 230B has at least a pixel electrode 224B, the light-emitting layer 232B, and the counter electrode 238. A common layer 228 is arranged between the pixel electrodes 224R, 224G, and 224B and the light-emitting layers 232R, 232G, and 232B. A common layer 236 is arranged between the light-emitting layers 232R, 232G, and 232B and the counter electrode 238. The common layers 228 and 236 are arranged in common over the light-emitting elements 230R, 230G, and 230B (over the display area). In FIG. 17 to FIG. 19, the pixel electrodes 224R, 224G, and 224B are anodes and the counter electrode 238 is a cathode. Therefore, the common layer 228 includes at least one of the hole transport layer and the hole injection layer, and the common layer 236 includes at least one of the electron transport layer and the electron injection layer.

In order to suppress unintended light emission in adjacent pixels, areas arranged with the light-emitting layer are preferred to be separated from each other so as not to overlap. However, in order for the areas arranged with the light-emitting layer to be separatory formed so as not to overlap each other, the openings 220R, 220G, and 220B need to be formed sufficiently separate from each other, and the definition deteriorates.

Therefore, as the definition of the display area is increased, the areas where the light-emitting layer is arranged may overlap. As shown in FIG. 17 to FIG. 19, a part of the light-emitting layer 232G and a part of the light-emitting layer 232B may overlap in the area where the pixel 205G and the pixel 205B are adjacent to each other.

FIG. 19 shows an enlarged view of an area 250A where the pixel 205G and the pixel 205B are adjacent to each other. The light-emitting layer 232B and the light-emitting layer 232G are arranged above the common layer 228 on an insulating layer 226. A part of the light-emitting layer 232B overlaps a part of the light-emitting layer 232G. Generally, a light emission start voltage of the light-emitting layer 232B is higher than light emission start voltages of a light-emitting layer 228R and the light-emitting layer 232G. Therefore, when the light-emitting element 230B is caused to emit light, a high voltage is applied to the light-emitting layer 232B, so that the holes in the common layer 228 move in the transverse direction from the pixel 205B to the pixel 205R and the pixel 205G. If the light-emitting layer 232B exhibits a hole-transport property, the holes pass through the light-emitting layer 232B in the thickness direction. Therefore, the light-emitting layer 232G emits light at an end portion of the light-emitting layer 232G. Alternatively, if the light-emitting layer 232B exhibits an electron-transport property, the holes do not pass through the light-emitting layer 232B in the thickness direction but move in the transverse direction. Therefore, the light-emitting layer 232G emits light in the vicinity of the end portion of the light-emitting layer 232B. In this specification and the like, a position where unintended light emission occurs in the light-emitting layer 232R or the light-emitting layer 232G adjacent to the light-emitting layer 232B is referred to as a starting point of light emission. Also, the light emission start voltage of the light-emitting layer 232R and the light emission start voltage of the light-emitting layer 232G are approximately the same. Therefore, even if the light-emitting element 230G is caused to emit light, the holes in the common layer 228 are prevented from moving in the transverse direction from the pixel 205G to the pixel 205R and the pixel 205B. Therefore, an end portion of the light-emitting layer 232R and the light-emitting layer 232G do not emit light in the area where the end portion of the light-emitting layer 232R overlaps the end portion of the light-emitting layer 232G.

Figure 20:
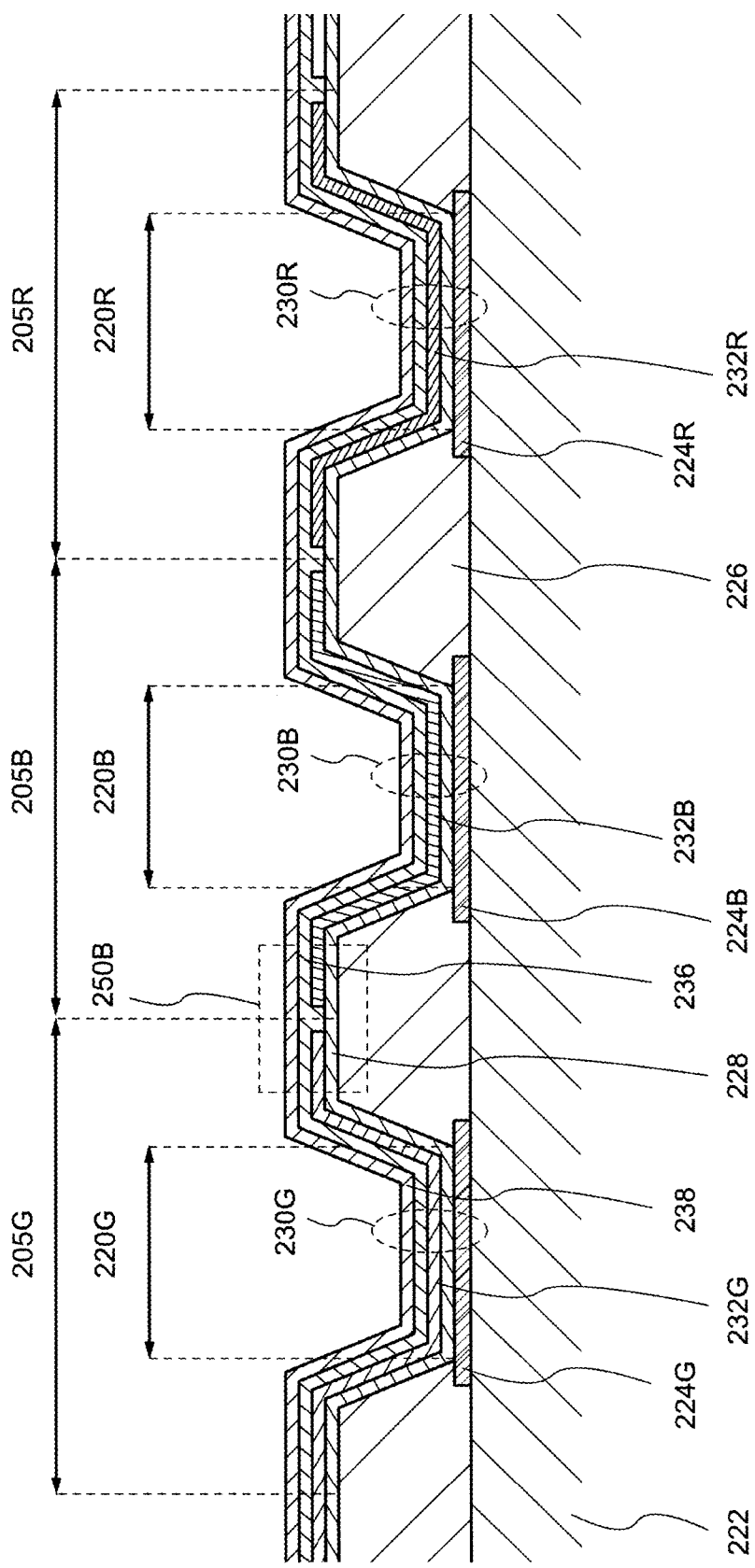
FIG. 20 is a cross-sectional view when a display area shown in FIG. 17 is cut along a line F1-F2.

As shown in FIG. 20, in the area where the pixel 205G and the pixel 205B are adjacent to each other, a part of the light-emitting layer 232G and a part of the light-emitting layer 232B may be separated.

Figure 21:
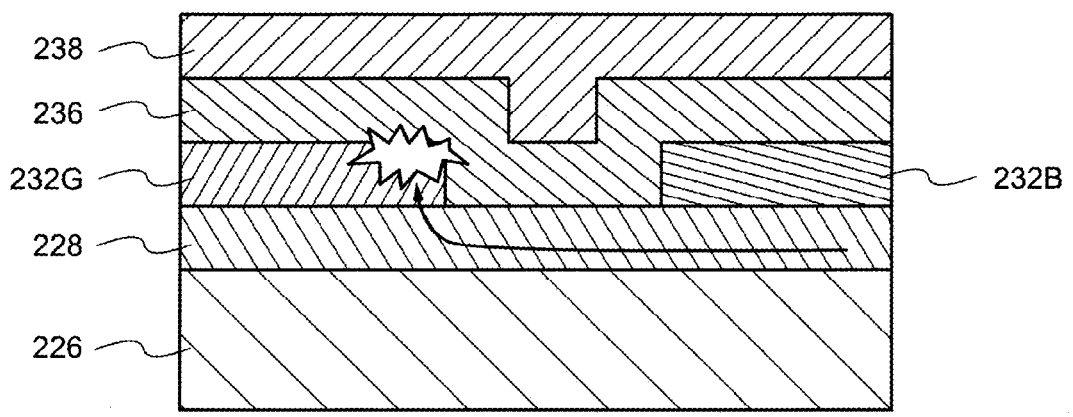
FIG. 21 is a partially enlarged view of the cross-sectional view shown in FIG. 20.

FIG. 21 shows an enlarged view of an area 250B where the pixel 205G and the pixel 205B are adjacent to each other. The light-emitting layer 232B and the light-emitting layer 232G are arranged above the common layer 228 on the insulating layer 226. The end portion of the light-emitting layer 232B is separated from the end portion of the light-emitting layer 232G. The light emission start voltage of the light-emitting layer 232B is higher than the light emission start voltages of the light-emitting layer 232G and the light-emitting layer 232R. Therefore, when the light-emitting element 230B is caused to emit light, a high voltage is applied to the light-emitting layer 232B, so that the holes in the common layer 228 move in the transverse direction from the pixel 205B to the pixel 205G and the pixel 205R. If the light-emitting layer 232B exhibits an electron-transport property, the holes do not pass through the thickness direction of the light-emitting layer 232B but move in the transverse direction. Therefore, the light-emitting layer 232G emits light even if the end portion of the light-emitting layer 232G is separated from the end portion of the light-emitting layer 232B.

As described above, since the light emission start voltages of the light-emitting layers 232R, 232G, and 232B are different from each other, even if the light-emitting layer 232B overlaps or does not overlap the adjacent light-emitting layers 232R and 232G, a leakage current in the transverse direction occurs, and the light-emitting layer emits light in an unintended area. In order to suppress unintended light emission in each light-emitting layer, it is conceivable to prevent the leakage current in the transverse direction by designing the light emission start voltages of the light-emitting layers 232R, 232G, and 232B to coincide with each other. However, it is a trade-off with the property of the light-emitting element due to the need for designs such as suppressing the property of the light-emitting element and carrier injections into the light-emitting layer. As described above, conventionally, it has been difficult to prevent unintended light emission caused by the leakage current in the transverse direction while improving the property of the light-emitting element.

As described in FIG. 17 to FIG. 21, the starting point of light emission differs depending on the order in which the common layer 228 and the light-emitting layers 232R, 232G, and 232B are stacked. In addition, the strength of the leakage current in the transverse direction depends on a distance from the light-emitting area of the light-emitting element 230B. Therefore, when the distance between the light-emitting area of the light-emitting element 230B and the end portion of the light-emitting layer 232B is designed to be small by increasing the definition, the strength of the leakage current increases. Therefore, the intensity of the unintended light emission in the light-emitting layer 232R and the light-emitting layer 232G arranged so as to overlap or be separated from the end portion of the light-emitting layer 232B also increases.

Therefore, in the display device 100 according to an embodiment of the present invention, arranging the carrier absorption layer 134 at a position where the end portions of the light-emitting layers 132R and 132G of the light-emitting elements 130R and 130G having a low light emission start voltage overlap the end portion of the light-emitting layer 132B of the light-emitting elements 130B having a higher light emission start voltage than the light-emitting elements 130R and 130G, and/or a position adjacent to a position where the end portion of the light-emitting layers 132R and 132G overlap the end portion of the light-emitting layer 132B, that is, at the end portion of the light-emitting layer 132B where unintended light emission is likely to occur suppresses light emission at the end portions of the light-emitting layers 132R and 132G. In this specification, a "carrier absorption layer" is a structure having a function of suppressing the transfer of carriers from a light-emitting layer having a high light emission start voltage to an overlapped light-emitting layer having a low light emission start voltage by absorbing carriers injected from the pixel electrode. In the present embodiment, an example in which the pixel electrode functions as an anode will be described. Therefore, in the present embodiment, the carrier absorption layer is a structure having a function of suppressing the transfer of holes by absorbing holes. Therefore, the carrier absorption layer 134 is composed of an electron transport material. As shown in FIG. 3, a plurality of light-emitting layers 132B is arranged in the Y-direction intersecting the X-direction, and the carrier absorption layer 134 is arranged contiguously at the end portion of the plurality of light-emitting layers 132B along the Y-direction.

In the present embodiment, although the case where the light emission start voltage of the light-emitting element 130B is higher than the light emission start voltages of the light-emitting elements 130R and 130G is exemplified, even when the light emission start voltage of the light-emitting element 130R is higher than the light emission start voltages of the light-emitting elements 130G and 130B or the light emission start voltage of the light-emitting element 130G is higher than the light emission start voltages of the light-emitting elements 130R and 130B, the effect according to the present embodiment can be obtained by arranging the carrier absorption layer 134 at the end portion of the light-emitting layer of the light-emitting element having a high light emission start voltage.

FIG. 4 is a partially enlarged view of the cross-sectional view shown in FIG. 3. FIG. 4 shows an enlarged view of a border area between the light-emitting element 130B and the light-emitting element 130G. As shown in FIG. 4, the carrier absorption layer 134 is arranged at the position where an end portion 132B-1 of the light-emitting layer 132B overlaps an end portion 132G-1 of the light-emitting layer 132G. Specifically, the carrier absorption layer 134 includes a first portion 134-1 arranged between the common layer 128 and the light-emitting layer 132G, or a second portion 134-2 arranged between the light-emitting layer 132B and the light-emitting layer 132G. In the carrier absorption layer 134, the first portion 134-1 and the second portion 134-2 have a contiguous shape. In a cross-sectional view, since the carrier absorption layer 134 is also arranged in a side surface of the end portion of the light-emitting layer 132B, the carrier absorption layer 134 may be defined as having a third part connecting the first portion 134-1 and the second portion 134-2.

In addition, the first portion 134-1 of the carrier absorption layer 134 may be arranged so as to be close to a light-emitting area (the opening 120G) of the light-emitting element 130G. A distance from an end portion of the opening 120B to an end portion of the opening 120G is d1. In this case, the end portion of the opening 120B refers to a part in contact with the pixel electrode 124B. In addition, the end portion of the opening 120G refers to a part in contact with the pixel electrode 124G. The first portion 134-1 of the carrier absorption layer 134 is arranged on a side closer to the opening 120G than an intermediate part d1/2 between the end portion of the opening 120G and the end portion of the opening 120B.

Although the end portion of the light-emitting layer 132B adjacent to the light-emitting layer 132R is not shown in detail in FIG. 4, it is the same as the end portion 132B-1 of the light-emitting layer 132B. That is, the carrier absorption layer 134 is arranged at a position where the end portion of the light-emitting layer 132B overlaps the end portion of the light-emitting layer 132R. Specifically, the carrier absorption layer 134 includes a first portion arranged between the common layer 128 and the light-emitting layer 132R, or a second portion arranged between the light-emitting layer 132B and the light-emitting layer 132R. In the carrier absorption layer 134, the first portion and the second portion have a contiguous shape. In a cross-sectional view, since the carrier absorption layer 134 is also arranged at the end portion of the light-emitting layer 132B, the carrier absorption layer 134 may be defined as having a third part connecting the first portion and the second portion.

The first portion of the carrier absorption layer 134 is arranged so as to be close to the light-emitting area (the opening 120R) of the light-emitting element 130R. A distance from the end portion of the opening 120B to the end portion of the opening 120R is d2. In this case, the end portion of the opening 120R refers to a part in contact with the pixel electrode 124R. The first portion of the carrier absorption layer 134 is arranged on a side closer to the opening 120R than an intermediate part d2/2 between the end portion of the opening 120G and the end portion of the opening 120B.

In this way, by separately arranging the end portion of the light-emitting layer 132B by the carrier absorption layer 134 from the end portions of the light-emitting layers 132R and 132G where unintended light emission is likely to occur, the carrier absorption layer 134 can absorb the holes at the end portion of the light-emitting layer 132B, thereby preventing the holes from moving in the thickness direction of the light-emitting layer 232B or the transverse direction. Therefore, the strength of the leakage current in the transverse direction from the light-emitting element 130B can be reduced at the end portion of the light-emitting layer 132B. As a result, it is possible to suppress the occurrence of unintended light emission in the light-emitting layer 132R or the light-emitting layer 132G.

<Modification of Carrier Absorption Layer>

Figure 5:
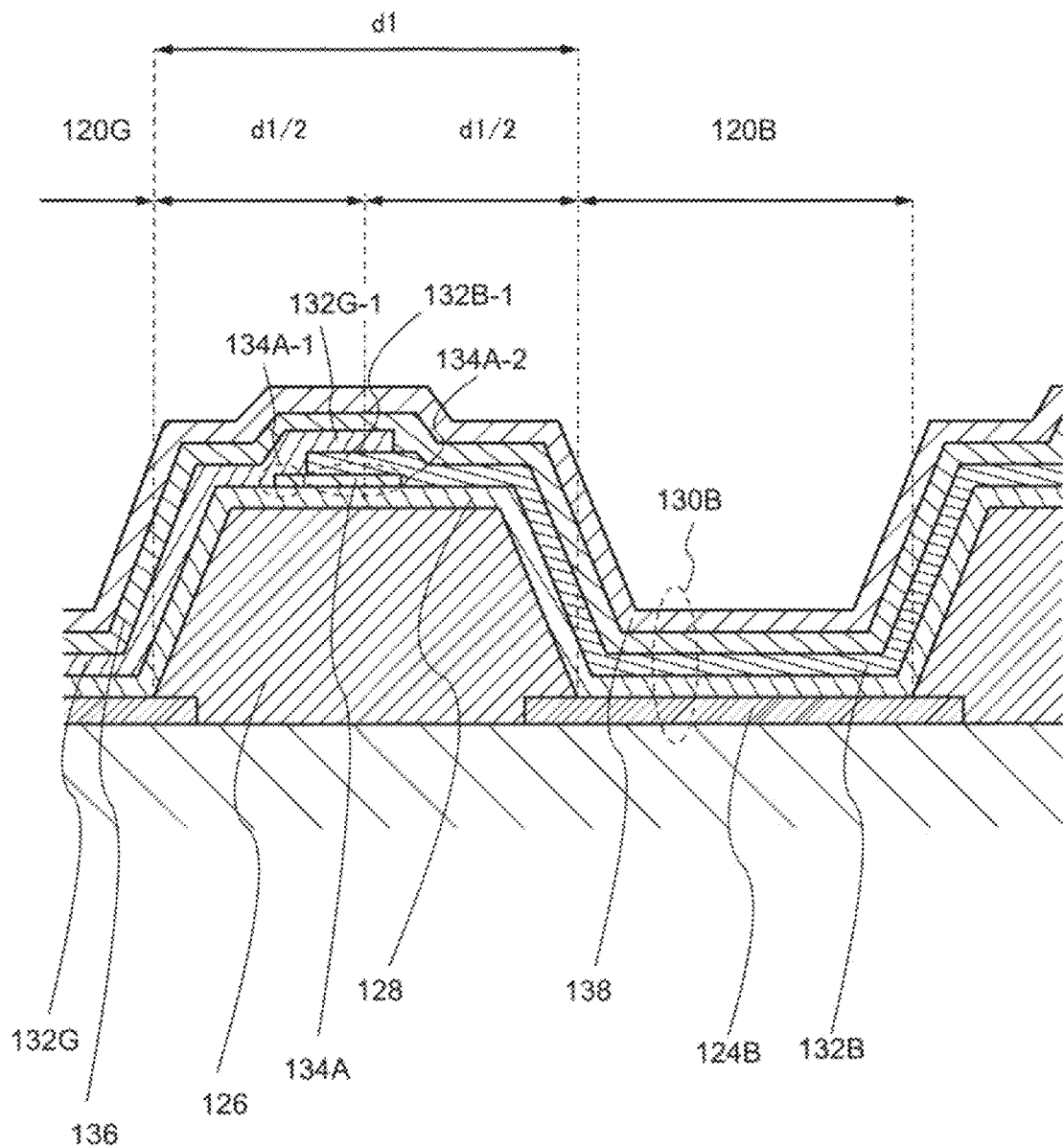
FIG. 5 is a partially enlarged view of the cross-sectional view shown in FIG. 3 for a modification of a carrier absorption layer according to an embodiment of the present invention.

A modification of the carrier absorption layer will be described. FIG. 5 is a partially enlarged view of the cross-sectional view shown in FIG. 3. FIG. 5 shows an enlarged view of a border area between the light-emitting element 130B and the light-emitting element 130G. A carrier absorption layer 134A is arranged at a position where the end portion 132B-1 of the light-emitting layer 132B overlaps the end portion 132G-1 of the light-emitting layer 132G. Specifically, the carrier absorption layer 134A includes a first portion 134A-1 arranged between the common layer 128 and the light-emitting layer 132G, or a second portion 134A-2 arranged between the common layer 128 and the light-emitting layer 132B. In the carrier absorption layer 134A, the first portion 134A-1 and the second portion 134A-2 have a contiguous plate-like shape.

In addition, the first portion 134A-1 of the carrier absorption layer 134A may be arranged so as to be close to the light-emitting area (the opening 120G) of the light-emitting element 130G. The distance from the end portion of the opening 120B to the end portion of the opening 120G is d1. In this case, the end portion of the opening 120B refers to a part in contact with the pixel electrode 124B. In addition, the end portion of the opening 120G refers to a part in contact with the pixel electrode 124G. The first portion 134A-1 of the carrier absorption layer 134A is arranged on a side closer to the opening 120G than an intermediate part d1/2 between the end portion of the opening 120G and the end portion of the opening 120B.

Although the end portion of the light-emitting layer 132B adjacent to the light-emitting layer 132R is not shown in detail in FIG. 5, it is the same as the end portion 132B-1 of the light-emitting layer 132B. That is, the carrier absorption layer 134A is arranged at the position where the end portion of the light-emitting layer 132B overlaps the end portion of the light-emitting layer 132R. Specifically, the carrier absorption layer 134A includes a first portion arranged between the common layer 128 and the light-emitting layer 132R, or a second portion arranged between the common layer 128 and the light-emitting layer 132B. In the carrier absorption layer 134A, the first portion and the second portion have a contiguous plate-like shape.

The first portion of the carrier absorption layer 134A is arranged so as to be close to the light-emitting area (the opening 120R) of the light-emitting element 130R. The distance from the end portion of the opening 120B to the end portion of the opening 120R is d2. In this case, the end portion of the opening 120R refers to a part in contact with the pixel electrode 124R. The first portion of the carrier absorption layer 134A is arranged on a side closer to the opening 120R than the intermediate part d2/2 between the end portion of the opening 120G and the end portion of the opening 120B.

In this way, at the end portion of the light-emitting layer 132B, the carrier absorption layer 134A can absorb the holes by arranging the end portion of the light-emitting layer 132B separately from the end portions of the light-emitting layers 132R and 132G where unintended light emission is likely to occur by the carrier absorption layer 134A, thereby preventing the holes from moving in the thickness direction of the light-emitting layer 232B or the transverse direction. Therefore, the strength of the leakage current in the transverse direction from the light-emitting element 130B can be reduced at the end portion of the light-emitting layer 132B. As a result, it is possible to suppress the occurrence of unintended light emission in the light-emitting layer 132R or the light-emitting layer 132G.

The light-emitting layer 132B in contact with the common layer 128 including at least one of the hole-transport layer and the hole injection layer preferably contains an electron-transporting light-emitting material. When the light-emitting element 130B emits light, it is possible to prevent the holes in the common layer 128 from passing through the light-emitting layer 132B in the thickness direction. The holes pass through the end portion of the light-emitting layer 132B in the transverse direction, so that the strength of the leakage current in the transverse direction can be further reduced. As a result, it is possible to suppress the occurrence of unintended light emission in the light-emitting layer 132R or the light-emitting layer 132G.

Although not shown in FIG. 3 to FIG. 5, a sealing film may be arranged above the light-emitting elements 130R, 130G, and 130B. The sealing film is composed by combining an inorganic insulating film and an organic insulating film. As a result, it is possible to prevent water from entering the organic layer including the light-emitting layer 132 and the common layers 128 and 136 in the light-emitting elements 130R, 130G, and 130B.

<Method for Manufacturing Display Device>

Next, a method for manufacturing the display device 100 will be described with reference to FIG. 6 to FIG. 8.

Figure 6:
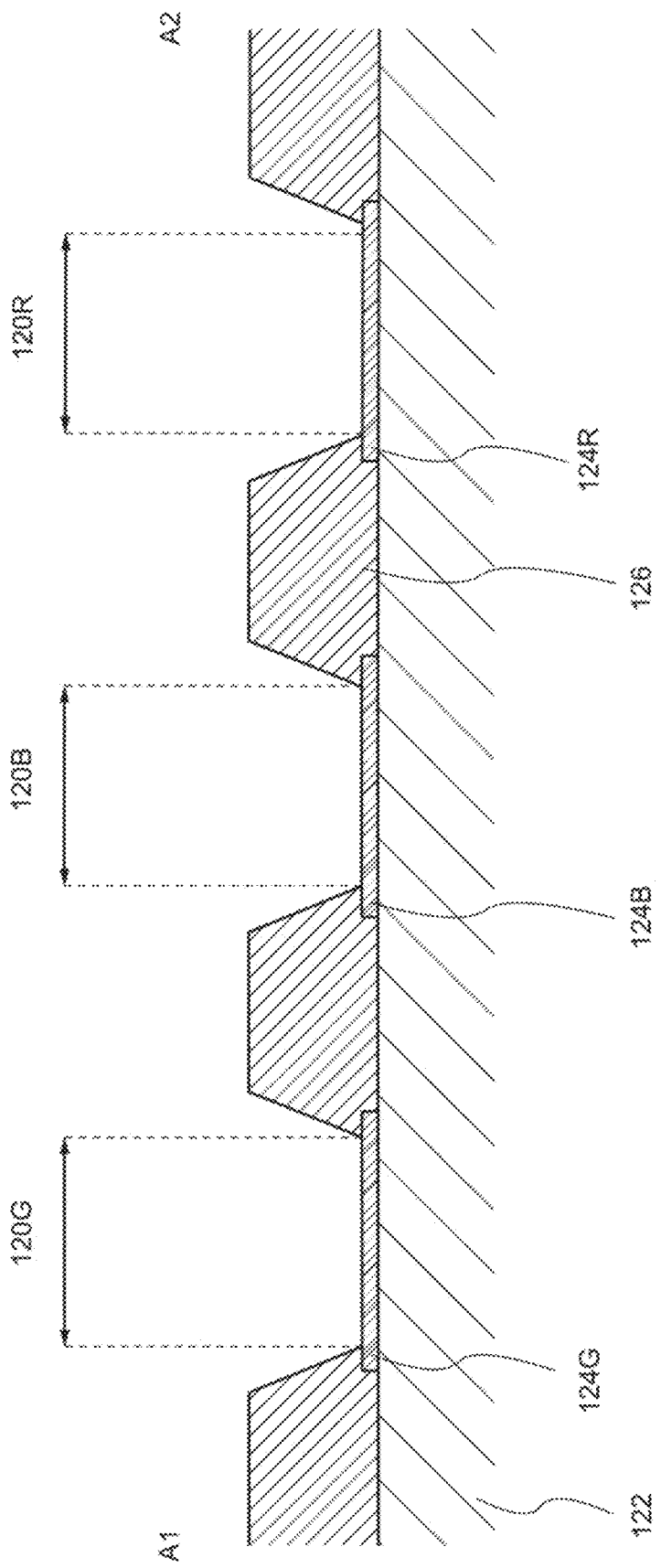
FIG. 6 is a cross-sectional view illustrating a method for manufacturing a display device according to an embodiment of the present invention.
Figure 7:
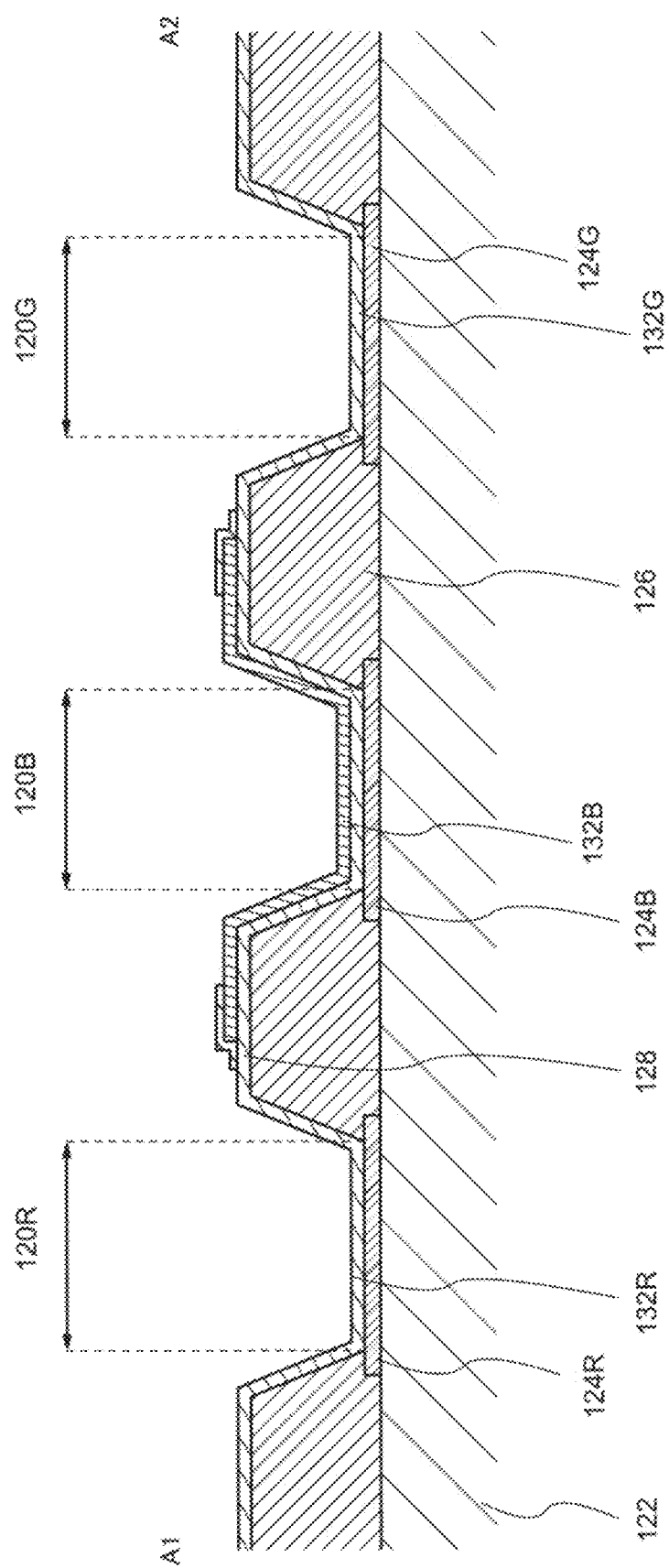
FIG. 7 is a cross-sectional view illustrating a method for manufacturing a display device according to an embodiment of the present invention.
Figure 8:
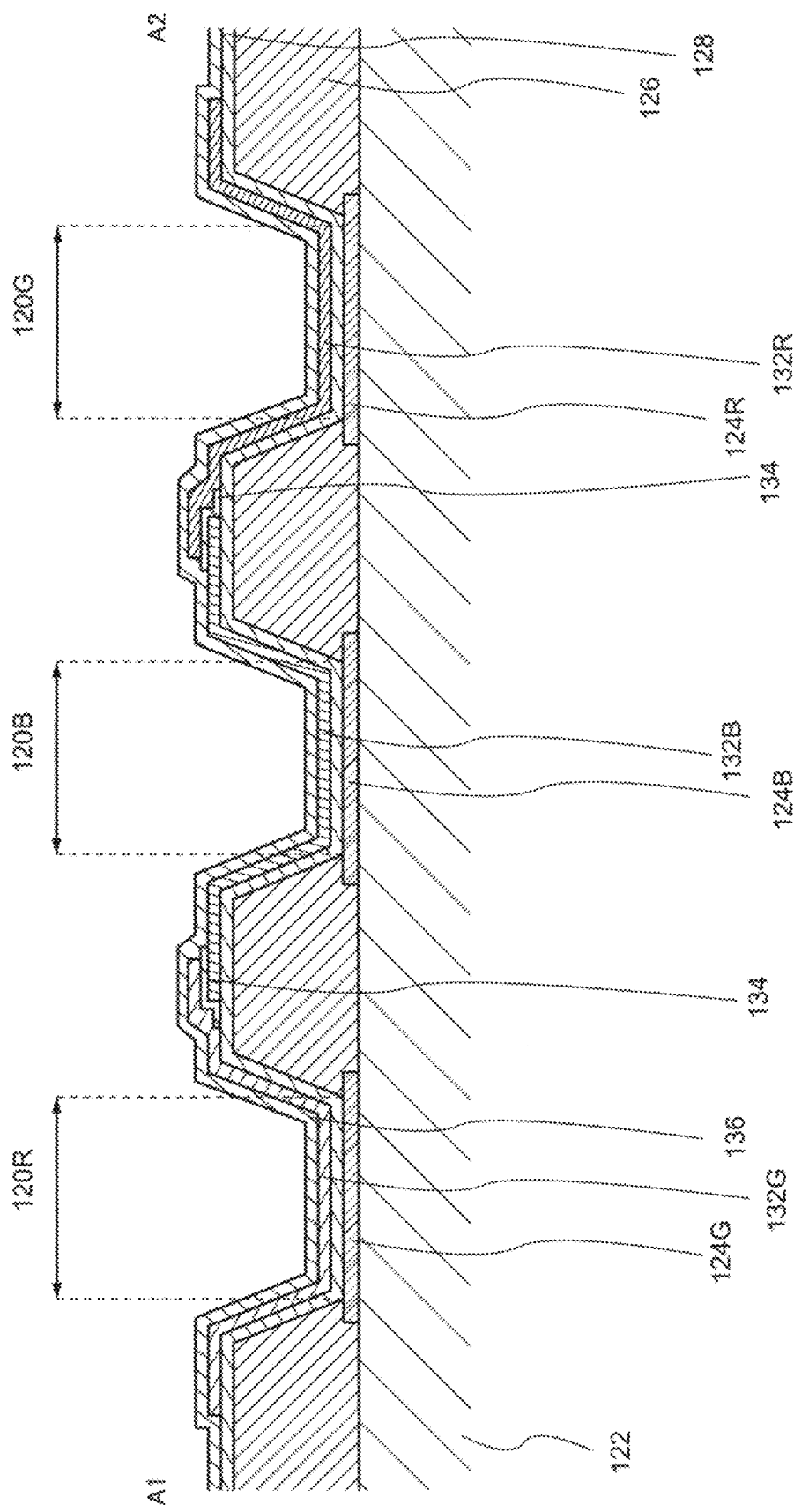
FIG. 8 is a cross-sectional view illustrating a method for manufacturing a display device according to an embodiment of the present invention.

Although not shown in FIG. 6 to FIG. 8, a transistor constituting the pixel circuit is arranged above the substrate 101. Also, since a known method for manufacturing the transistor may be applied to a method for manufacturing the pixel circuit formed on the substrate 101, a detailed explanation thereof is omitted. An interlayer insulating film containing at least one of silicon oxide and silicon nitride is formed on the transistor. A source electrode and a drain electrode are formed on the interlayer insulating film.

FIG. 6 is a diagram illustrating a process for forming the insulating film 122, the pixel electrodes 124R, 124G, and 124B, and an insulating layer 126. The insulating film 122 functions as a flattening film. The insulating film 122 is made of an organic resin material. The organic resin material may be a known organic resin material such as a polyimide-based, polyamide-based, acrylic-based, epoxy-based, or siloxane-based organic resin. Arranging the insulating film 122 on the transistor or the interlayer insulating film makes it possible to relieve any unevenness of the transistor. A contact hole is formed in the insulating film 122.

The pixel electrodes 124R, 124G, and 124B are formed on the insulating film 122. Each of the pixel electrodes 124R, 124G, and 124B is electrically connected to the source electrode or the drain electrode connected to the transistor via the contact hole arranged in the insulating film 122. In the present embodiment, the pixel electrodes 124R, 124G, and 124B function as anodes. A highly reflective metal film is used as the pixel electrodes 124R, 124G, and 124B. Alternatively, a stacked structure of a high-work-function transparent conductive layer such as an indium-oxide-based transparent conductive layer (e.g., ITO) or a zinc-oxide-based transparent conductive layer (e.g., IZO, ZnO) and the metal film is used as the pixel electrodes 124R, 124G, and 124B.

The insulating layer 126 made of an organic resin material is formed on the pixel electrodes 124R, 124G, and 124B. A known organic resin material such as a polyimide-based, polyamide-based, acrylic-based, epoxy-based, or siloxane-based organic resin material can be used. The insulating layer 126 has the openings 120R, 120G, and 120B for each of a part of the pixel electrode 124R, a part of the pixel electrode 124G, and a part of the pixel electrode 124B. The insulating layer 126 is arranged so as to cover end portions (edges) of the pixel electrodes 124R, 124G, and 124B between the adjacent pixel electrodes 124R, 124G, and 124B. The insulating layer 126 functions as a member that separates the adjacent pixel electrodes 124R, 124G, and 124B. Therefore, the insulating layer 126 is also commonly referred to as a "barrier" or a "bank." A part of the pixel electrodes 124R, 124G, and 124B exposed by the openings 120R, 120G, and 120B of the insulating layer 126 is the light-emitting area of the light-emitting elements 130R, 130G, and 130B. The openings 120R, 120G, and 120B of the insulating layer 126 are preferably such that the inner wall is a tapered shape. Therefore, when forming the common layer 128 and the light-emitting layers 132R, 132G, and 132B, which will be described later, it is possible to reduce a coverage defect at the end portions of the pixel electrodes 124R, 124G, and 124B.

FIG. 7 is a diagram illustrating a process for forming the common layer 128, the light-emitting layer 132B, and the carrier absorption layer 134. the common layer 128 is formed on the pixel electrodes 124R, 124G, and 124B and the insulating layer 126. The common layer 128 includes at least one of the hole transport layers and the hole injection layer. Known materials may be used as the hole transport layer and the hole injection layer as appropriate.

The light-emitting layers 132R, 132G, and 132B are preferably formed in the order of the light-emitting layer having the highest light emission start voltage. In the present embodiment, the light emission start voltage of the light-emitting layer 132B is higher than the light emission start voltages of the light-emitting layer 132R and the light-emitting layer 132G. Therefore, the light-emitting layer 132B is first formed on the common layer 128. The end portion 132B-1 of the light-emitting layer 132B is formed so as to be close to the opening 120R arranged in the insulating layer 126. In addition, the end portion 132B-1 of the light-emitting layer 132B is formed so as to be close to the opening 120G arranged in the insulating layer 126. In addition, the light-emitting layer 132B is preferably a light-emitting material having an electron-transport property, and a known material may be appropriately used.

The carrier absorption layer 134 is arranged at the end portion 132B-1 of the light-emitting layer 132B. Specifically, the first portion 134-1 of the carrier absorption layer 134 is arranged at a position on the common layer 128 adjacent to the end portion 132B-1 of the light-emitting layer 132B, and the second portion 134-2 of the carrier absorption layer 134 is arranged above the end portion 132B-1 of the light-emitting layer 132B. In addition, in a cross-sectional view, the carrier absorption layer 134 is also arranged on the side surface of the end portion of the light-emitting layer 132B, and the carrier absorption layer 134 in which the first portion 134-1 and the second portion 134-2 have a contiguous shape is formed. The carrier absorption layer 134 is selected from known materials having electron transport properties. Also, a thickness of the carrier absorption layer 134 is not particularly limited as long as the movement of the holes can be sufficiently suppressed. For example, the thickness may be 10 nm or more.

Also, in the case of manufacturing a display device having the carrier absorption layer 134A, the carrier absorption layer 134A is arranged above the common layer 128, and the end portion 132B-1 of the light-emitting layer 132B is formed at a position corresponding to the second portion 134-2 of the carrier absorption layer 134A. In the later process, the light-emitting layer 132G may be formed so as to cover the position corresponding to the first portion 134-1 of the carrier absorption layer 134A.

FIG. 8 is a diagram illustrating a process for forming the light-emitting layer 132R, the light-emitting layer 132G, and the common layer 136. The light-emitting layer 132G is formed in the opening 120G. A first end portion of the light-emitting layer 132G is formed to overlap the light-emitting layer 132B via the carrier absorption layer 134. Specifically, the first end portion of the light-emitting layer 132G is arranged above the common layer 128 via the first portion 134-1 of the carrier absorption layer 134 and extends over the end portion 132B-1 of the light-emitting layer 132B via the second portion 134-2 of the carrier absorption layer 134.

In addition, the light-emitting layer 132R is formed in the opening 120R. A first end portion of the light-emitting layer 132R is formed to overlap the light-emitting layer 132B via the carrier absorption layer 134. Specifically, the first end portion of the light-emitting layer 132R is arranged above the common layer 128 via the first portion 134-1 of the carrier absorption layer 134 and extends over the end portion 132B-1 of the light-emitting layer 132B via the second portion 134-2 of the carrier absorption layer 134.

Next, the common layer 136 is formed on the light-emitting layers 132R, 132G, and 132B. The common layer 136 includes at least one of the electron transport layers and the electron injection layer. Known materials may be used as the electron transport layer and the electron injection layer as appropriate. Also, in FIG. 8, although an example is shown in which the second portion 134-2 of the carrier absorption layer 134 is exposed from the first end portion of the light-emitting layer 132R and the first end portion of the light-emitting layer 132G and the common layer 136 is arranged above the second portion 134-2 of the exposed carrier absorption layer 134, the present invention is not limited to such an arrangement, and the second portion 134-2 of the carrier absorption layer 134 may not be exposed from the first end portion of the light-emitting layer 132R and the first end portion of the light-emitting layer 132G as long as the light-emitting layer 132B can be separated from the first end portion of the light-emitting layer 132R or the first end portion or the light-emitting layer 132G.

Finally, the display device 100 shown in FIG. 3 can be formed by forming the counter electrode 138 on the common layer 136.

In the present embodiment, although the case where the light-emitting layer 132R is formed after the light-emitting layer 132G is formed is described, the present invention is not limited to this. As long as the light emission start voltage of the light-emitting layer 132G and the light emission start voltage of the light-emitting layer 132R are approximately the same, either layer may be formed first. Alternatively, if there is a difference between the light emission start voltage of the light-emitting layer 132G and the light emission start voltage of the light-emitting layer 132R, the light-emitting layer having a higher light emission start voltage may be formed first.

In FIG. 2, although the structure is shown in which the end portion of the light-emitting layer 132R and the end portion of the light-emitting layer 132G adjacent to each other overlap, the end portion of the light-emitting layer 132R and the end portion of the light-emitting layer 132G adjacent to each other may not overlap. This is because, if the light emission start voltage of the light-emitting layer 132R and the light emission start voltage of the light-emitting layer 132G are approximately the same, even if the light-emitting element 130R or the light-emitting element 130G emits light, the effect of the leakage current in the transverse direction from the light-emitting layer 132R and the light-emitting layer 132G is small.

In addition, in the present embodiment, although the method for manufacturing the display device 100 has been described as exemplifying the case where the light emission start voltage of the light-emitting element 130B is higher than the light emission start voltages of the light-emitting elements 130R and 130G, the display device 100 according to the present embodiment can be manufactured by forming the carrier absorption layer 134 at the end portion of the light-emitting layer having a higher light emission start voltage even if the light emission start voltage of the light-emitting element 130R is higher than the light emission start voltages of the light-emitting elements 130G and 130B or even if the light emission start voltage of the light-emitting element 130G is higher than the light emission start voltages of the light-emitting elements 130R and 130B.

The display device 100 according to an embodiment of the present invention is not limited to the configuration shown in FIG. 2 to FIG. 5. For example, the arrangement of the pixels 105R, 105G, and 105B is not limited to the arrangement of the pixels 105R, 105G, and 105B shown in FIG. 2.

Next, display devices 100A to 100F according to Modifications 1 to 6 in which a part of the components of the display device 100 is changed will be described with reference to FIG. 9 to FIG. 16. In the display devices 100A to 100E according to Modifications 1 to 5, the arrangement of the light-emitting layers 132R, 132G, and 132B is different from the arrangement in the display device 100. In addition, in the display device 100F according to Modification 6, the arrangement of the anode and the cathode is different from the arrangement of the anode and the cathode in the display device 100. In the following description, the same components as those of the display device 100 may be referred in to the descriptions of FIG. 2 to FIG. 5.

<Modification 1>

Figure 9:
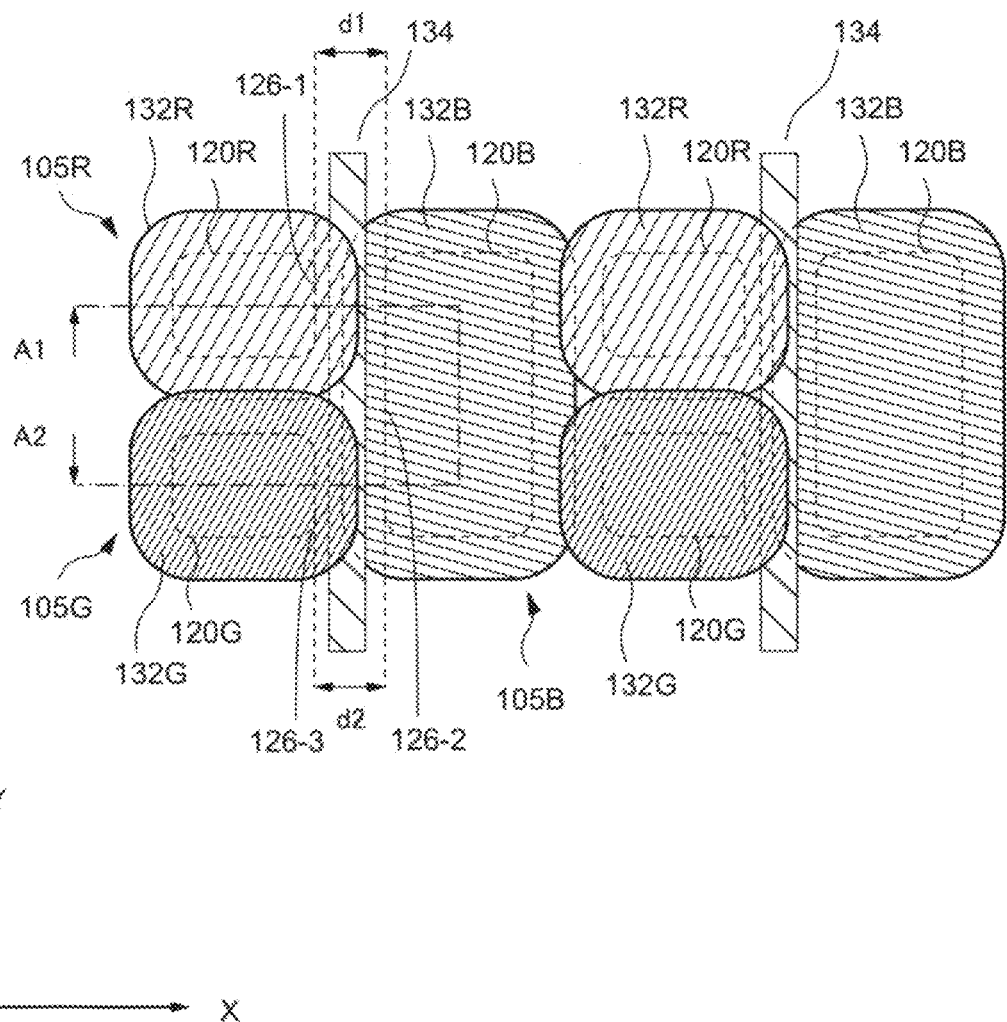
FIG. 9 is a pixel layout diagram when a display device according to an embodiment of the present invention is in a plan view.
Figure 10:
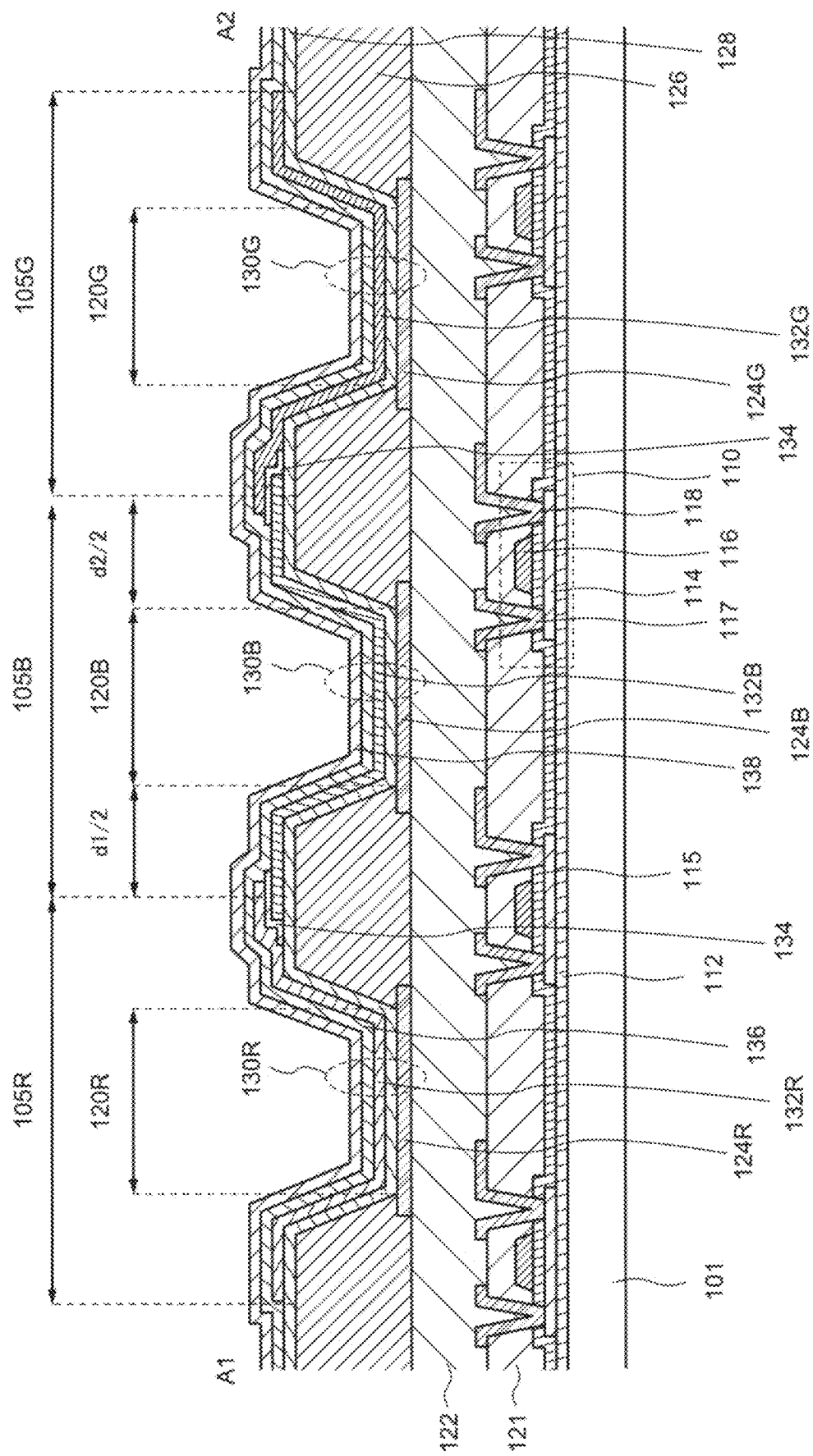
FIG. 10 is a cross-sectional view when a display device shown in FIG. 9 is cut along a line A1-A2.

FIG. 9 is a pixel layout diagram when the display device 100A according to an embodiment of the present invention is in a plan view. In addition, FIG. 10 is a cross-sectional view when the display device 100A shown in FIG. 9 is cut along a line A1-A2. In Modification 1, the display device 100A with a square arrangement in which the light-emitting layers 132R and 132G having a smaller area than the light-emitting layer 132B are combined and arranged so as to be a rectangular shape will be described. In Modification 1, the case where the light emission start voltage of the light-emitting layer 132B is higher than the light emission start voltages of the light-emitting layer 132R and the light-emitting layer 132G will be described.

FIG. 9 shows an area where the pixels 105R, 105G, and 105B are arranged. The pixel 105R and the pixel 105B are arranged side by side in the X-direction. The pixel 105G and the pixel 105B are arranged side by side in the X-direction. The pixel 105R and the pixel 105G are arranged side by side in the Y-direction. In FIG. 9, an area indicated by a solid line is an area where the light-emitting layers 132R, 132G, and 132B are arranged. In addition, an area surrounded by a dotted line is an area where the openings 120R, 120G, and 120B are arranged in the insulating layer. Also, in the display device 100A, the stacking order of the light-emitting layers 132R, 132G, and 132B is the same as in the display device 100.

As shown in FIG. 10, when the display device 100A is viewed in a cross-section, the first end portion of the light-emitting layer 132B overlaps the light-emitting layers 132R and 132G. In addition, the second end portion of the light-emitting layer 132B facing the first end portion overlaps the other light-emitting layers 132R and 132G. In this case, the carrier absorption layer 134 is arranged at a position where the first end portion of the light-emitting layer 132B overlaps the light-emitting layers 132R and 132G and/or a position adjacent to the position where the first end portion of the light-emitting layer 132B overlaps the light-emitting layers 132R and 132G. In addition, the carrier absorption layer 134 is also arranged at a position where the second end portion of the light-emitting layer 132B overlaps the light-emitting layers 132R and 132G and/or a position adjacent to the position where the second end portion of the light-emitting layer 132B overlaps the light-emitting layers 132R and 132G. In the display device 100A, a plurality of light-emitting layers 132B is arranged in the Y-direction, and the carrier absorption layer 134 is arranged contiguously at the end portion of the plurality of light-emitting layers 132B along the Y-direction.

Also, the first end portion of the light-emitting layer 132B is preferably arranged so as to be close to the openings 120R and 120G of the light-emitting elements 130R and 130G. In addition, the second end portion of the light-emitting layer 132B is preferably arranged so as to be close to the openings 120R and 120G of the other light-emitting elements 130R and 130G. Since the end portion of the light-emitting layer 132B is separated from the light-emitting area of the light-emitting layer 132B, unintended light emission can be suppressed in the light-emitting layers 132R and 132G.

In the display device 100A, the carrier absorption layer 134 may have the same configuration as that described for the display device 100. That is, the carrier absorption layer 134 includes a first portion arranged between the common layer 128 and the light-emitting layers 132R and 132G, or a second portion arranged between the light-emitting layer 132B and the light-emitting layers 132R and 132G. In the carrier absorption layer 134, the first portion and the second portion have a contiguous shape. In addition, the first portion of the carrier absorption layer 134 may be arranged so as to be close to the light-emitting area (the openings 120R and 120G) of the light-emitting elements 130R and 130G.

In this way, at the end portion of the light-emitting layer 132B, the carrier absorption layer 134 can absorb the holes by arranging the end portion of the light-emitting layer 132B separately from the end portion of the light-emitting layers 132R and 132G where unintended light emission is likely to occur by the carrier absorption layer 134, thereby preventing the holes from moving in the thickness direction of the light-emitting layer 232B or the transverse direction. Therefore, the strength of the leakage current in the transverse direction from the light-emitting element 130B can be reduced at the end portion of the light-emitting layer 132B. As a result, it is possible to suppress the occurrence of unintended light emission in the light-emitting layer 132R or the light-emitting layer 132G. In addition, the carrier absorption layer 134A described above can also be applied to the display device 100A.

Also, in Modification 1, the carrier absorption layer 134A described above can be arranged in place of the carrier absorption layer 134. In the case of manufacturing the display device 100A having the carrier absorption layer 134A, the carrier absorption layer 134A may be arranged above the common layer 128, and the end portion of the light-emitting layer 132B may be formed at a position corresponding to the second portion of the carrier absorption layer 134. In the later process, the position corresponding to the first portion of the carrier absorption layer 134A may be covered, and the end portions of the light-emitting layers 132R and 132G may be formed so as to overlap the second portion of the carrier absorption layer 134 and the end portion of the light-emitting layer 132B.

<Modification 2>

Figure 11:
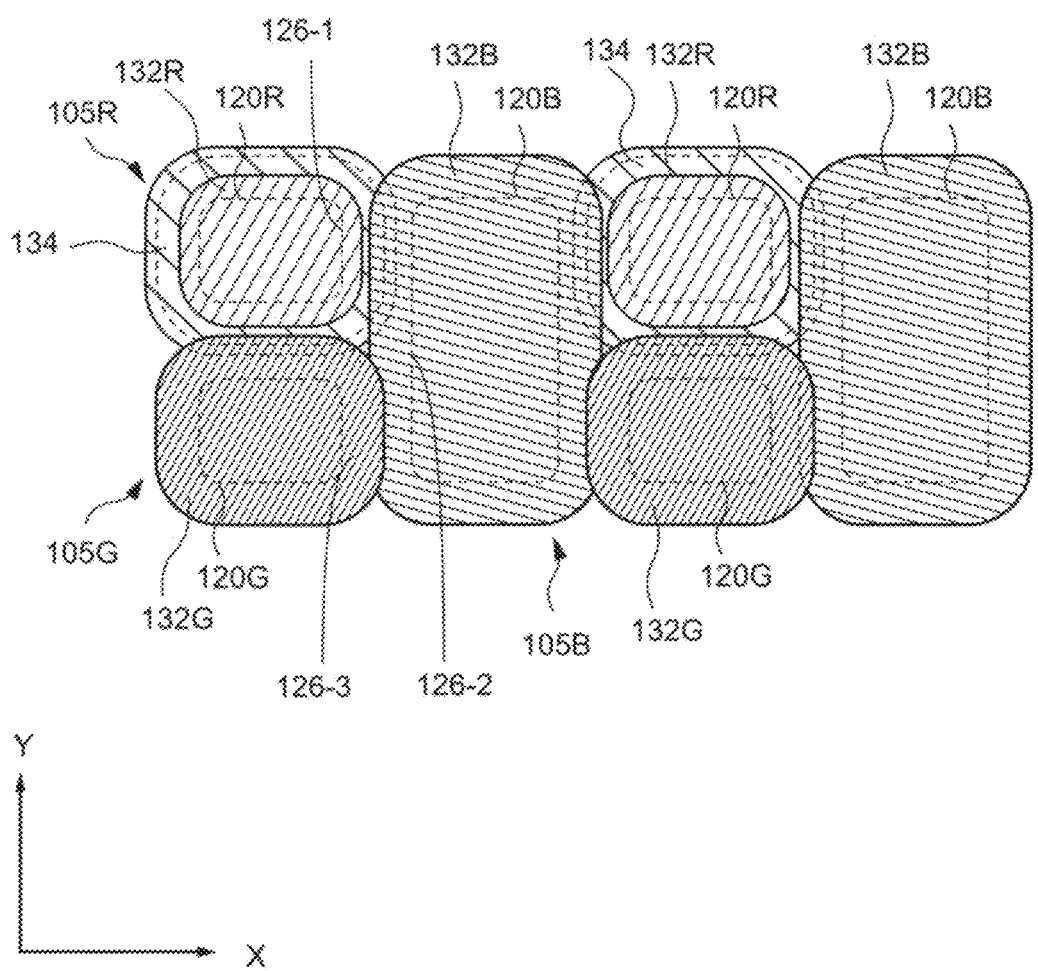
FIG. 11 is an enlarged view of a pixel layout when a display device is in a plan view.

FIG. 11 is a pixel layout diagram when the display device 100B according to an embodiment of the present invention is in a plan view. In the square arrangement described in Modification 2, the case where the light emission start voltage of the light-emitting layer 132R having a smaller area than the light-emitting layer 132B is higher than the light emission start voltages of the light-emitting layer 132G and the light-emitting layer 132B will be described.

Since the light emission start voltage of the light-emitting layer 132R is higher than the light emission start voltages of the light-emitting layer 132B and the light-emitting layer 132G, a leakage current occurs in the transverse direction from the light-emitting layer 132R to the light-emitting layers 132B and 132G, so that unintended light emission is likely to occur. Therefore, in Modification 2, the leakage current in the X-direction from the light-emitting layer 132R to the light-emitting layer 132B needs to be prevented, and the leakage current in the Y-direction from the light-emitting layer 132R to the light-emitting layer 132G needs to be prevented.

As shown in FIG. 11, in the display device 100B, the carrier absorption layer 134 is arranged at least at a position where the end portion of the light-emitting layer 132R overlaps the end portion of the light-emitting layer 132B and a position where the end portion of the light-emitting layer 132R overlaps the light-emitting layer 132G. In this case, the carrier absorption layer 134 is arranged at the position where the end portion of the light-emitting layer 132R overlaps the light-emitting layers 132B and 132G and/or the position where the end portion of the light-emitting layer 132R overlaps the light-emitting layers 132B and 132G. An example in which the carrier absorption layer 134 is arranged at an outer edge of the light-emitting layer 132R so as to surround the light-emitting layer 132R is shown in FIG. 11. Also, in the display device 100B, the carrier absorption layer 134 may be arranged only at the position where the end portion of the light-emitting layer 132R overlaps the end portion of the light-emitting layer 132B, and at the position where the end portion of the light-emitting layer 132R overlaps the light-emitting layer 132G.

In addition, the end portion of the light-emitting layer 132R is preferably arranged so as to be close to the opening 120B and 120G of the light-emitting elements 130B and 130G. Since the end portion of the light-emitting layer 132R is separated from the light-emitting area of the light-emitting layer 132R, unintended light emission can be suppressed in the light-emitting layers 132B and 132G.

In the display device 100B, the carrier absorption layer 134 may have the same configuration as that described for the display device 100. That is, the carrier absorption layer 134 includes a first portion arranged between the common layer 128 and the light-emitting layers 132B and 132G, or a second portion arranged between the light-emitting layer 132R and the light-emitting layers 132B and 132G. In the carrier absorption layer 134, the first portion and the second portion have a contiguous shape. In addition, the first portion of the carrier absorption layer 134 may be arranged so as to be close to the light-emitting area (the openings 120B and 120G) of the light-emitting elements 130B and 130G.

In this way, at the end portion of the light-emitting layer 132R, the carrier absorption layer 134 can absorb the holes by arranging the end portion of the light-emitting layer 132R having a small area separately from the end portions of the light-emitting layers 132B and 132G where unintended light emission is likely to occur by the carrier absorption layer 134, thereby preventing the holes from moving in the thickness direction of the light-emitting layer 232R or the transverse direction. Therefore, the strength of the leakage current in the transverse direction from the light-emitting element 130R can be reduced at the end portion of the light-emitting layer 132R. As a result, it is possible to suppress the occurrence of unintended light emission in the light-emitting layer 132B or the light-emitting layer 132G.

Also, the present modification can also be applied to the square arrangement in which the light emission start voltage of the light-emitting layer 132G is higher than the light emission start voltages of the light-emitting layer 132B and the light-emitting layer 132R. That is, the carrier absorption layer 134 may be arranged at a position where the end portion of the light-emitting layer 132G overlaps the light-emitting layers 132B and 132R and/or a position adjacent to the position where the end portion of the light-emitting layer 132G overlaps the light-emitting layers 132B and 132R. For example, the carrier absorption layer 134 may be arranged at an outer edge of the light-emitting layer 132G so as to surround the light-emitting layer 132G.

In this way, at the end portion of the light-emitting layer 132G, the carrier absorption layer 134 can absorb the holes by arranging the end portion of the light-emitting layer 132G having a small area separately from the end portion of the light-emitting layers 132B and 132R where unintended light emission is likely to occur by the carrier absorption layer 134, thereby preventing the holes from moving in the thickness direction of the light-emitting layer 132G or the transverse direction. Therefore, the strength of the leakage current in the transverse direction from the light-emitting element 130G can be reduced at the end portion of the light-emitting layer 132G. As a result, it is possible to suppress the occurrence of unintended light emission in the light-emitting layer 132B or the light-emitting layer 132R.

Also, in Modification 2, the carrier absorption layer 134A described above can be arranged in place of the carrier absorption layer 134. In the case of manufacturing the display device 100B having the carrier absorption layer 134A, the carrier absorption layer 134A may be arranged above the common layer 128, the end portion of the light-emitting layer 132R may be formed at the position corresponding to the second portion of the carrier absorption layer 134. In the later process, the position corresponding to the first portion of the carrier absorption layer 134A may be covered, and the end portions of the light-emitting layers 132G and 132B may be formed so as to overlap the second portion of the carrier absorption layer 134 and the end portion of the light-emitting layer 132R. In addition, the carrier absorption layer 134A can also be applied to the square arrangement in which the light emission start voltage of the light-emitting layer 132G is higher than the light emission start voltages of the light-emitting layer 132B and the light-emitting layer 132R by a similar method.

<Modification 3>

Figure 12:
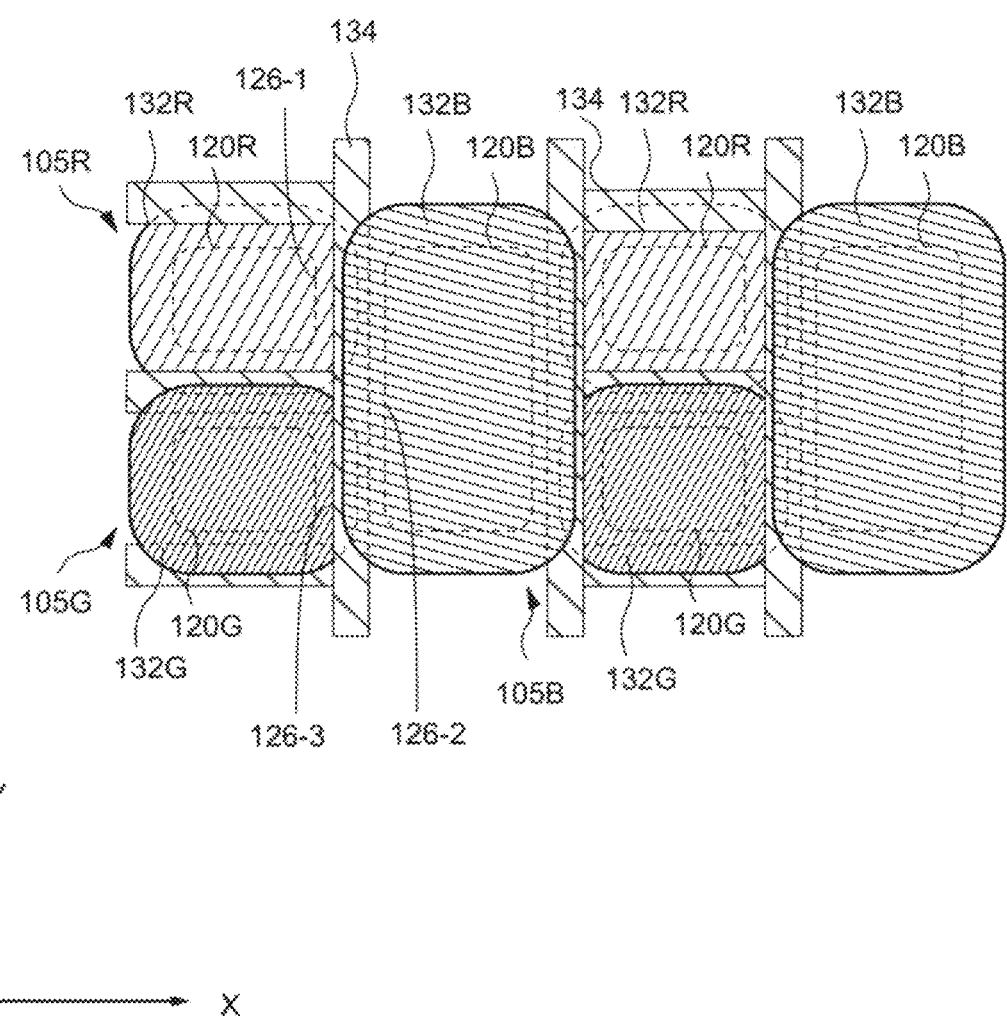
FIG. 12 is an enlarged view of a pixel layout when a display device is in a plan view.

Modification 1 in which the light emission start voltage of the light-emitting layer 132B having a large area in the square arrangement is higher than the light emission start voltages of the light-emitting layers 132R and 132G having a small area and Modification 2 in which the light emission start voltage of the light-emitting layer 132R or the light-emitting layer 132B having a smaller area than the light-emitting layer 132B is higher than the light emission start voltage of the light-emitting layer 132B having a large area are described. In Modification 3, the case where the light emission start voltages of the light-emitting layers 132R, 132G, and 132B differ from each other in the square arrangement will be described. FIG. 12 is a pixel layout diagram when the display device 100C according to an embodiment of the present invention is in a plan view.

When the light emission start voltage of the light-emitting layer 132R is higher than the light emission start voltage of the light-emitting layer 132G and the light emission start voltage of the light-emitting layer 132G is higher than the light emission start voltage of the light-emitting layer 132B, the leakage current in the X-direction from the light-emitting layer 132R to the light-emitting layer 132B needs to be prevented and the leakage current in the Y-direction from the light-emitting layer 132R to the light-emitting layer 132G needs to be prevented.

As shown in FIG. 12, in the display device 100C, the carrier absorption layer 134 is arranged at the position where the end portion of the light-emitting layer 132R overlaps the light-emitting layer 132G and at the position where the end portion of the light-emitting layer 132R overlaps the end portion of the light-emitting layer 132B. In this case, the carrier absorption layer 134 is arranged at a position where the end portion of the light-emitting layer 132R overlaps the light-emitting layers 132G and 132B, and/or a position adjacent to the position where the end portion of the light-emitting layer 132R overlaps the light-emitting layers 132G and 132B. In FIG. 12, although the example of a ladder shape is shown in which the carrier absorption layer 134 extending in the X-direction is arranged at the position where the end portion of the light-emitting layer 132R overlaps the end portion of the light-emitting layer 132G, and the carrier absorption layer 134 extending in the Y-direction is arranged at the position where the end portion of the light-emitting layer 132B overlaps the end portion of the light-emitting layers 132R and 132G, the arrangement of the carrier absorption layer 134 is not limited to this. For example, the carrier absorption layer 134 may be arranged at the outer edge of the light-emitting layer 132R so as to surround the light-emitting layer 132R, and the carrier absorption layer 134 may be arranged at the outer edge of the light-emitting layer 132G so as to surround the light-emitting layer 132G.

In addition, the end portion of the light-emitting layer 132R is preferably arranged so as to be close to the openings 120G and 120B of the light-emitting elements 130G and 130B. The end portion of the light-emitting layer 132G is preferably arranged so as to be close to the openings 120R and 120B of the light-emitting elements 130R and 130B. Since the end portions of the light-emitting layers 132R and 132G are separated from the light-emitting areas of the light-emitting layers 132R and 132G, unintended light emission can be suppressed in the light-emitting layers 132G and 132B.

In the display device 100C, the carrier absorption layer 134 may have the same configuration as that described for the display device 100. In this way, at the end portion of the light-emitting layer 132R, the carrier absorption layer 134 can absorb the holes by arranging the end portion of the light-emitting layer 132R having a small area separately from the end portion of the light-emitting layers 132B and 132G where unintended light emission is likely to occur by the carrier absorption layer 134, thereby preventing the holes from moving in the thickness direction of the light-emitting layer 132R or the transvers direction. Therefore, the strength of the leakage current in the transverse direction from the light-emitting element 130R can be reduced at the end portion of the light-emitting layer 132R. As a result, it is possible to suppress the occurrence of unintended light emission in the light-emitting layer 132B or the light-emitting layer 132G.

Also, the present modification can also be applied to the square arrangement in which the light emission start voltage of the light-emitting layer 132G is higher than the light emission start voltages of the light-emitting layer 132B and the light-emitting layer 132R. That is, the carrier absorption layer 134 may be arranged at the position where the end portion of the light-emitting layer 132G overlaps the light-emitting layers 132B and 132R and/or the position adjacent to the position where the end portion of the light-emitting layer 132G overlaps the light-emitting layers 132B and 132R. For example, the carrier absorption layer 134 may be arranged at the outer edge of the light-emitting layer 132G so as to surround the light-emitting layer 132G.

In this way, at the end portions of the light-emitting layers 132R, 132G, and 132B, the carrier absorption layer 134 can absorb the holes by arranging the end potions of the light-emitting layers 132R, 132G, and 132B separately by the carrier absorption layer 134, thereby preventing the holes from moving in the thickness direction of the light-emitting layers 132R and 132G or the transverse direction. Therefore, the strength of the leakage current in the X-direction from the light-emitting layers 132R and 132G to the light-emitting layer 132B can be reduced at the end portions of the light-emitting layers 132R and 132G. In addition, the strength of the leakage current in the Y-direction from the light-emitting layer 132R to the light-emitting layer 132G can be reduced at the end portion of the light-emitting layer 132R. As a result, it is possible to suppress the occurrence of unintended light emission in the light-emitting layer 132G or the light-emitting layer 132B.

Also, in Modification 3, the carrier absorption layer 134A described above can be arranged in place of the carrier absorption layer 134. For example, in the case of manufacturing the display device 100C having the carrier absorption layer 134A, the ladder-shaped carrier absorption layer 134A shown in FIG. 12 is arranged above the common layer 128, and the end portion of the light-emitting layer 132R is formed at the position corresponding to the second portion of the carrier absorption layer 134A. In the later process, the end portion of the light-emitting layer 132G is formed so as to cover the position corresponding to the first portion of the carrier absorption layer 134A and overlap the second portion of the carrier absorption layer 134 and the end portion of the light-emitting layer 132R. In addition, the end portion of the light-emitting layer 132B may be formed so as to cover the position corresponding to the first portion of the carrier absorption layer 134A and overlap the second portion of the carrier absorption layer 134 and the end portion of the light-emitting layer 132R, and to cover the position corresponding to the first portion of the carrier absorption layer 134A and overlap the second portion of the carrier absorption layer 134 and the end portion of the light-emitting layer 132G.

<Modification 4>

Figure 13:
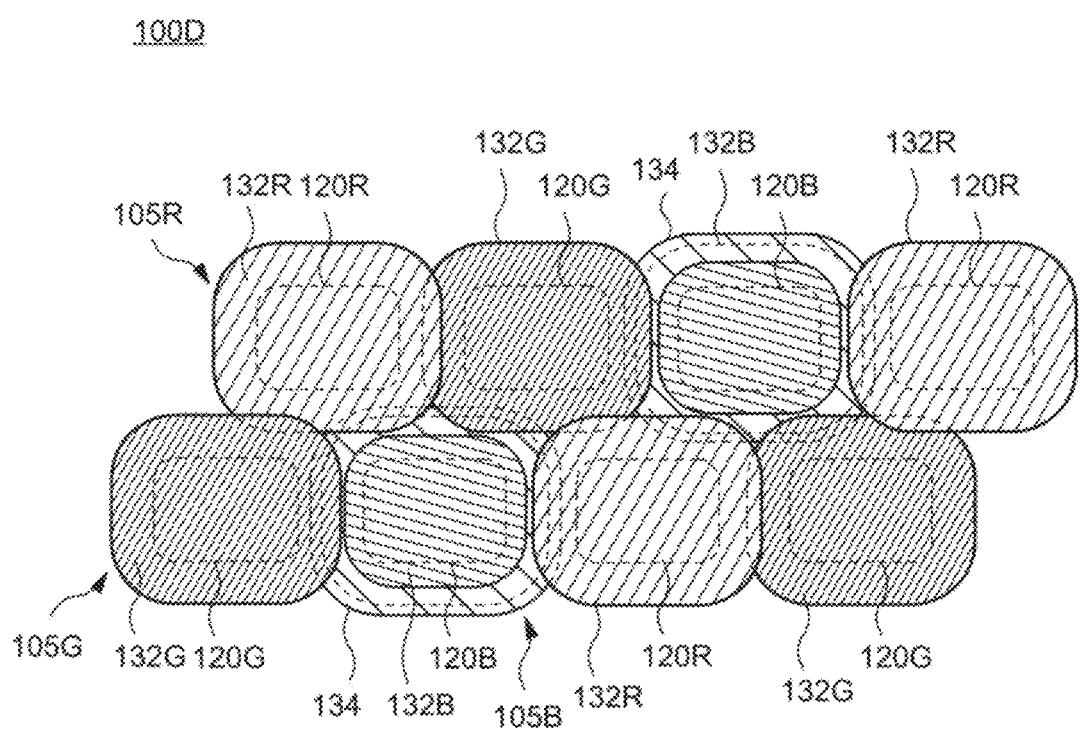
FIG. 13 is an enlarged view of a pixel layout when a display device is in a plan view.

FIG. 13 is a pixel layout diagram when the display device 100D according to an embodiment of the present invention is in a plan view. In Modification 4, the display device 100D with a delta arrangement in which the light-emitting layers 132R, 132G, and 132B arranged in the first column and the light-emitting layers 132R, 132G, and 132B arranged in the second column are arranged half-shifted in the X-direction with respect to the length of the light-emitting layer in the X-direction will be described. In Modification 4, the case where the light emission start voltage of the light-emitting layer 132B is higher than the light emission start voltages of the light-emitting layer 132R and the light-emitting layer 132G will be described.

Since the light emission start voltage of the light-emitting layer 132B is higher than the light emission start voltages of the light-emitting layer 132R and the light-emitting layer 132G, the leakage current in the transverse direction from the light-emitting layer 132B to the light-emitting layers 132R and 132G occurs, and unintended light emission is likely to occur. Therefore, in Modification 4, the leakage current in the X-direction from the light-emitting layer 132B to the light-emitting layers 132R and 132G needs to be prevented, and the leakage current in the Y-direction from the light-emitting layer 132B to the light-emitting layers 132R and 132G needs to be prevented.

As shown in FIG. 13, in the display device 100D, the carrier absorption layer 134 is arranged at least at a position where the end portion of the light-emitting layer 132B overlaps the end portion of the light-emitting layer 132R and a position where the end portion of the light-emitting layer 132B overlaps the light-emitting layer 132G. In this case, the carrier absorption layer 134 is arranged at a position where the end portion of the light-emitting layer 132B overlaps the light-emitting layers 132R and 132G and/or a position adjacent to the position where the end portion of the light-emitting layer 132B overlaps the light-emitting layers 132R and 132G. In FIG. 13, an example in which the carrier absorption layer 134 is arranged at an outer edge of the light-emitting layer 132B so as to surround the light-emitting layer 132B. Also, in the display device 100D, the carrier absorption layer 134 may be arranged only at the position where the end portion of the light-emitting layer 132B overlaps the end portion of the light-emitting layer 132R, and at the position where the end portion of the light-emitting layer 132B overlaps the light-emitting layer 132G.

In addition, the end portion of the light-emitting layer 132B is preferably arranged so as to be close to the openings 120R and 120G of the light-emitting elements 130R and 130G. Since the end portion of the light-emitting layer 132B is separated from the light-emitting area of the light-emitting layer 132B, unintended light emission can be suppressed in the light-emitting layers 132R and 132G.

In the display device 100D, the carrier absorption layer 134 may have the same configuration as that described for the display device 100. That is, similar to the configuration of the carrier absorption layer 134 described for the display device 100B, the carrier absorption layer 134 includes a first portion arranged between the common layer 128 and the light-emitting layers 132R and 132G, or a second portion arranged between the light-emitting layer 132B and the light-emitting layers 132R and 132G. In the carrier absorption layer 134, the first portion and the second portion have a contiguous shape. In addition, the first portion of the carrier absorption layer 134 may be arranged so as to be close to the light-emitting areas (the openings 120R and 120G) of the light-emitting elements 130R and 130G.

In this way, at the end portion of the light-emitting layer 132B, the carrier absorption layer 134 can absorb the holes by arranging the end portion of the light-emitting layer 132B separately from the end portions of the light-emitting layers 132R and 132G where unintended light emission is likely to occur by the carrier absorption layer 134, thereby preventing the holes from moving in the thickness direction of the light-emitting layer 132B or the transverse direction. Therefore, the strength of the leakage current in the transverse direction from the light-emitting element 130B can be reduced at the end portion of the light-emitting layer 132B. As a result, it is possible to suppress the occurrence of unintended light emission in the light-emitting layer 132R or the light-emitting layer 132G.

Also, the present modification can also be applied to the delta arrangement in which the light emission start voltage of the light-emitting layer 132R is higher than the light emission start voltages of the light-emitting layer 132G and the light-emitting layer 132B, and the delta arrangement in which the light emission start voltage of the light-emitting layer 132G is higher than the light emission start voltages of the light-emitting layer 132R and the light-emitting layer 132B. That is, the carrier absorption layer 134 may be arranged at the position where the end portion of the light-emitting layer 132R overlaps the light-emitting layers 132G and 132B and/or the position adjacent to the position where the end portion of the light-emitting layer 132R overlaps the light-emitting layers 132G and 132B. Alternatively, the carrier absorption layer 134 may be arranged at the position where the end portion of the light-emitting layer 132G overlaps the light-emitting layers 132R and 132B and/or a position adjacent to the position where the end portion of the light-emitting layer 132G overlaps the light-emitting layers 132R and 132B. For example, the carrier absorption layer 134 may be arranged at the outer edge of the light-emitting layer 132R or 132G so as to surround the light-emitting layer 132R or 132G.

In this way, at the end portion of the light-emitting layer 132R or 132G, the carrier absorption layer 134 can absorb the holes by arranging the end portion of the light-emitting layer 132R or 132G separately from the end portion of the light-emitting layer 132B, 132R or 132G where unintended light emission is likely to occur by the carrier absorption layer 134, thereby preventing the holes from moving in the thickness direction of the light-emitting layer 132R or 132G or the transverse direction. Therefore, the strength of the leakage current in the transverse direction from the light-emitting layer 132R or 132G can be reduced at the end portion of the light-emitting layer 132R or 132G. As a result, it is possible to suppress the occurrence of unintended light emission in the adjacent light-emitting layers.

Also, in Modification 4, the carrier absorption layer 134A described above can be arranged in place of the carrier absorption layer 134. In the case of manufacturing the display device 100B having the carrier absorption layer 134A, the carrier absorption layer 134A is arranged above the common layer 128, and the end portion of the light-emitting layer 132B is formed at the position corresponding to the second portion of the carrier absorption layer 134. In the later process, the end portions of the light-emitting layers 132R and 132G may be formed so as to cover the position corresponding to the first portion of the carrier absorption layer 134A and overlap the second portion of the carrier absorption layer 134 and the end portion of the light-emitting layer 132B. In addition, the carrier absorption layer 134A can also be applied to the delta arrangement in which the light emission start voltage of the light-emitting layer 132R or 132G is higher than light emission start voltages of the other light-emitting layers by a similar method.

<Modification 5>

FIG. 14 is a pixel layout diagram when the display device 100E according to an embodiment of the present invention is in a plan view. In Modification 5, the case where the light-emitting elements 130R, 130G, and 130B are arranged in a pentile pattern will be described.

FIG. 14 shows an area where the pixels 105R, 105G, and 105B are arranged. The plurality of pixels 105G is arranged side by side in the X-direction. The pixel 105G and the pixel 105B are arranged in the X-direction. The pixel 105G and the pixel 105B are arranged side by side in a θ direction with respect to the X-direction. In addition, the pixel 105G and the pixel 105R are arranged side by side in the θ direction with respect to the X-direction. In Modification 5, the case where the light emission start voltage of the light-emitting layer 132B is higher than the light emission start voltages of the light-emitting layer 132R and the light-emitting layer 132G will be described.

Since the light emission start voltage of the light-emitting layer 132B is higher than the light emission start voltages of the light-emitting layer 132R and the light-emitting layer 132G, the leakage current in the transverse direction from the light-emitting layer 132B to the light-emitting layers 132R and 132G occurs, and unintended light emission is likely to occur. Therefore, in Modification 5, the leakage current in the Y-direction from the light-emitting layer 132B to the light-emitting layer 132R needs to be prevented, and the leakage current in the θ direction from the light-emitting layer 132B to the light-emitting layer 132G needs to be prevented.

As shown in FIG. 14, in the display device 100E, the carrier absorption layer 134 is arranged at least at the position where the end portion of the light-emitting layer 132B overlaps the end portion of the light-emitting layer 132R and the position where the end portion of the light-emitting layer 132B overlaps the light-emitting layer 132G. In this case, the carrier absorption layer 134 is arranged at the position where the end portion of the light-emitting layer 132B overlaps the light-emitting layers 132R and 132G and/or the position adjacent to the position where the end portion of the light-emitting layer 132B overlaps the light-emitting layers 132R and 132G. FIG. 14 shows an example in which the carrier absorption layer 134 is arranged at the outer edge of the light-emitting layer 132B so as to surround the light-emitting layer 132B. Also, in the display device 100E, the carrier absorption layer 134 may be arranged only at the position where the end portion of the light-emitting layer 132B overlaps the end portion of the light-emitting layer 132R, and at the position where the end portion of the light-emitting layer 132B overlaps the light-emitting layer 132G.

In addition, the end portion of the light-emitting layer 132B is preferably arranged so as to be close to the openings 120R and 120G of the light-emitting elements 130R and 130G. Since the end portion of the light-emitting layer 132B is separated from the light-emitting area of the light-emitting layer 132B, unintended light emission can be suppressed in the light-emitting layers 132R and 132G.

In the display device 100E, the carrier absorption layer 134 may have the same configuration as that described for the display device 100. That is, similar to the configuration of the carrier absorption layer 134 described for the display device 100B, the carrier absorption layer 134 includes a first portion arranged between the common layer 128 and the light-emitting layers 132R and 132G, or a second portion arranged between the light-emitting layer 132B and the light-emitting layers 132R and 132G. In the carrier absorption layer 134, the first portion and the second portion have a contiguous shape. In addition, the first portion of the carrier absorption layer 134 may be arranged so as to be close to the light-emitting areas (openings 120R and 120G) of the light-emitting elements 130R and 130G.

In this way, at the end portion of the light-emitting layer 132B, the carrier absorption layer 134 can absorb the holes by arranging the end portion of the light-emitting layer 132B separately from the end portions of the light-emitting layers 132R and 132G where unintended light emission is likely to occur by the carrier absorption layer 134, thereby preventing the holes from moving in the thickness direction of the light-emitting layer 132B or the transverse direction. Therefore, the strength of the leakage current in the transverse direction from the light-emitting element 130B can be reduced at the end portion of the light-emitting layer 132B. As a result, it is possible to suppress the occurrence of unintended light emission in the light-emitting layer 132R or the light-emitting layer 132G.

Also, the present modification can also be applied to a pentile arrangement in which the light emission start voltage of the light-emitting layer 132R is higher than the light emission start voltages of the light-emitting layer 132G and the light-emitting layer 132B, and a pentile arrangement in which the light emission start voltage of the light-emitting layer 132G is higher than the light emission start voltages of the light-emitting layer 132R and the light-emitting layer 132B. That is, the carrier absorption layer 134 may be arranged at the position where the end portion of the light-emitting layer 132R overlaps the light-emitting layers 132G and 132B and/or the position adjacent to the position where the end portion of the light-emitting layer 132R overlaps the light-emitting layers 132G and 132B. Alternatively, the carrier absorption layer 134 may be arranged at the position where the end portion of the light-emitting layer 132G overlaps the light-emitting layers 132R and 132B and/or the position adjacent to the position where the end portion of the light-emitting layer 132G overlaps the light-emitting layers 132R and 132B. For example, the carrier absorption layer 134 may be arranged at the outer edge of the light-emitting layer 132R or 132G so as to surround the light-emitting layer 132R or 132G.

In this way, at the end portion of the light-emitting layer 132R or 312G, the carrier absorption layer 134 can absorbs the holes by arranging the end portion of the light-emitting layer 132R or 132G separately from the end portion of the light-emitting layer 132B, 132R, or 132G where unintended light emission is likely to occur by the carrier absorption layer 134, thereby preventing the holes from moving in the thickness direction of the light-emitting layer 132R or 132G or the transverse direction. Therefore, the strength of the leakage current in the transverse direction from the light-emitting layer 132R or the light-emitting element 130G can be reduced at the end portion of the light-emitting layer 132R or 132G. As a result, it is possible to suppress the occurrence of unintended light emission in the adjacent light-emitting layers.

Also, in Modification 5, the carrier absorption layer 134A described above can be arranged in place of the carrier absorption layer 134. In the case of manufacturing a display device 100B having the carrier absorption layer 134A, the carrier absorption layer 134 is arranged above the common layer 128, and the end portion of the light-emitting layer 132B is formed at the position corresponding to the second portion of the carrier absorption layer 134. In the later process, the end portions of the light-emitting layers 132R and 132G may be formed so as to cover the position corresponding to the first portion of the carrier absorption layer 134A and overlap the second portion of the carrier absorption layer 134 and the end portion of the light-emitting layer 132B. In addition, the carrier absorption layer 134A can also be applied to the delta arrangement in which the light emission start voltage of the light-emitting layer 132R or 132G is higher than the light emission start voltages of the other emitting layers by a similar method.

<Modification 6>

Figure 15:
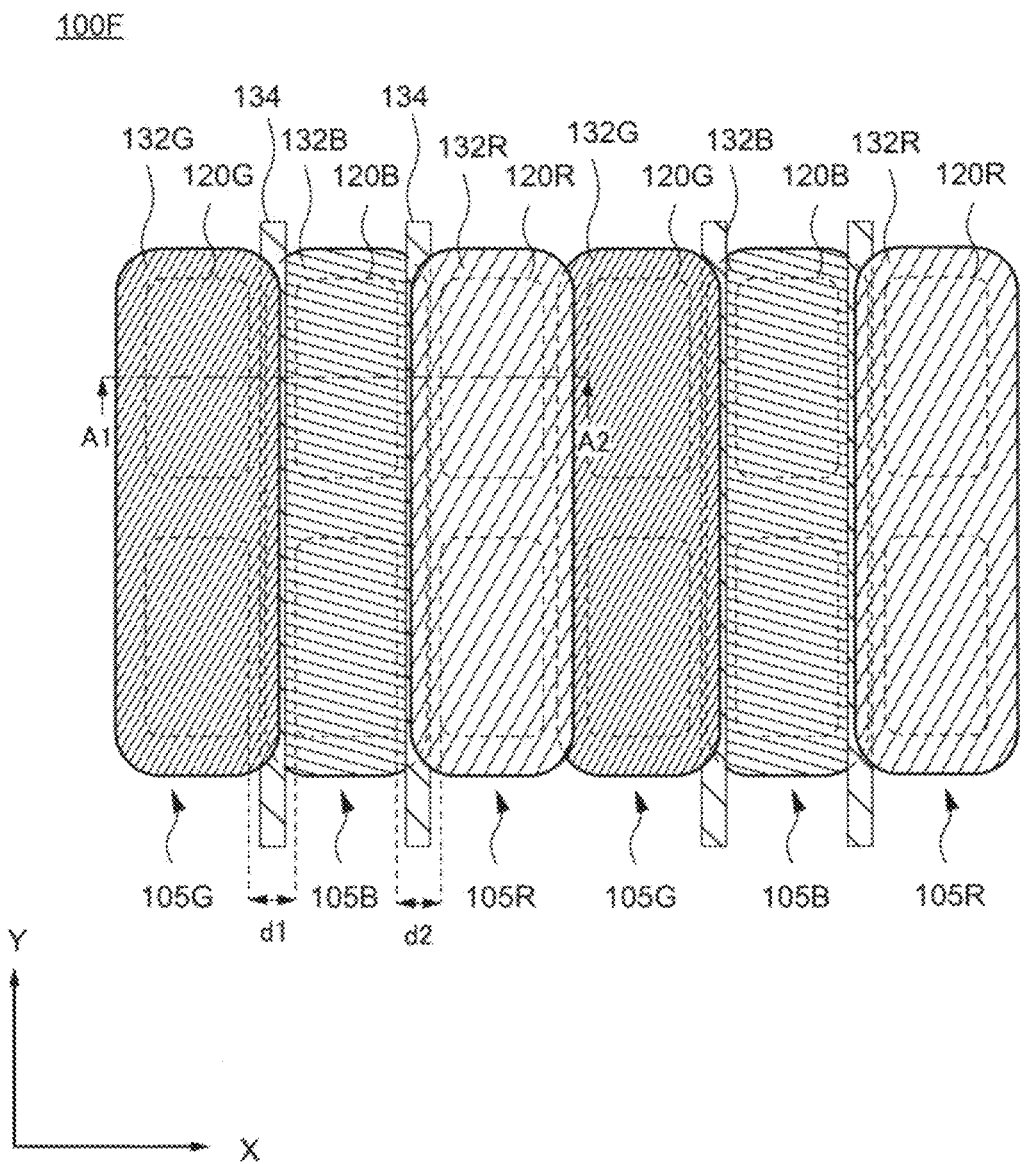
FIG. 15 is an enlarged view of a pixel layout when a display device is in a plan view.
Figure 16:
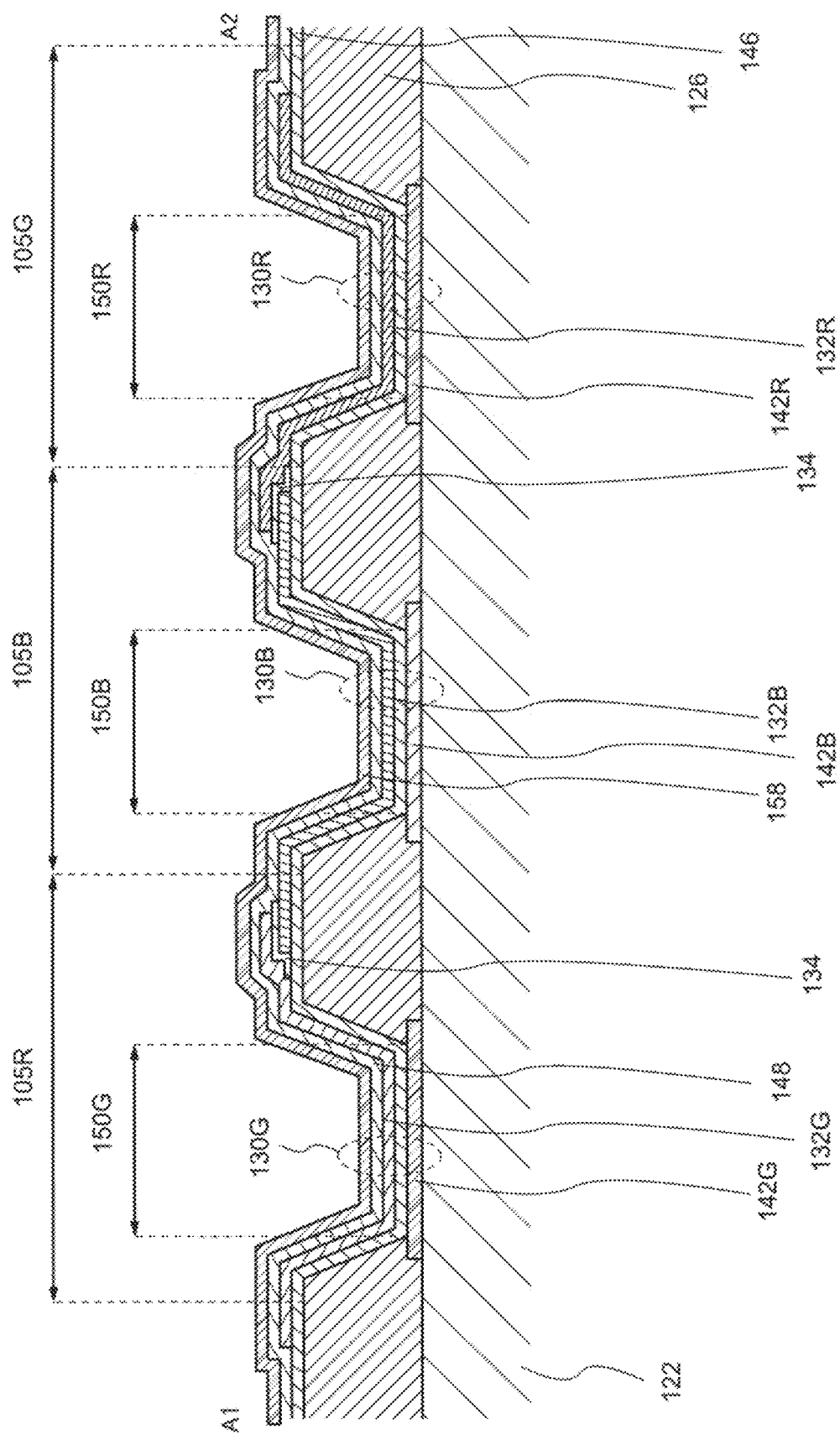
FIG. 16 is a cross-sectional view when a display device shown in FIG. 15 is cut along a line A1-A2.

FIG. 15 is a pixel layout diagram when the display device 100F according to an embodiment of the present invention is in a plan view. In addition, FIG. 16 is a cross-sectional view when the display device 100F shown in FIG. 15 is cut along a line A1-A2. An example in which pixel electrodes 142R, 142G, and 142B of the display device 100F function as cathodes will be described as Modification 6. Also, in Modification 6, the light emission start voltage of the light-emitting layer 132B is higher than the light emission start voltages of the light-emitting layer 132R and the light-emitting layer 132G.

FIG. 15 shows an area where the pixels 105R, 105G, and 105B are arranged. The arrangement of the pixels 105R, 105G, and 105B is the same as the arrangement of the pixels shown in FIG. 2.

FIG. 16 shows a cross-sectional view of the pixels 105R, 105G, and 105B. A light-emitting element 150R is arranged in the pixel 105R, a light-emitting element 150G is arranged in the pixel 105G, and a light-emitting element 150B is arranged in the pixel 105B on the insulating film 122. The light-emitting element 150R has at least the pixel electrode 142R, the light-emitting layer 132R, and a counter electrode 158. The light-emitting element 150G has at least the pixel electrode 142G, the light-emitting layer 132G, and the counter electrode 158. The light-emitting element 150B has at least the pixel electrode 142B, the light-emitting layer 132B, and the counter electrode 158.

The display device 100F is different from the display device 100 in that the pixel electrodes 142R, 142G, and 142B function as the cathodes and the counter electrode 158 functions as the anode. Therefore, in the present modification, the carrier absorption layer 134 is a structure having a function of suppressing the transfer of electrons by absorbing electrons. Therefore, the carrier absorption layer 134 is formed of a hole transport material. A common layer 156 arranged between the pixel electrodes 142R, 142G, and 142B and the light-emitting layers 132R, 132G, and 132B includes at least one of the electron-transport layer and the electron injection layer. In addition, the common layer 148 arranged between the counter electrode 158 and the light-emitting layers 132R, 132G, and 132B includes at least one of the hole-transport layer and the hole injection layer. Although not shown in FIG. 16, each of the pixel electrodes 142R, 142G, and 142B is electrically connected to the transistor 110 included in the pixel circuit.

The carrier absorption layer 134 is arranged at a position where the end portion of the light-emitting layer 132B overlaps the end portion of the light-emitting layer 132G. Specifically, the carrier absorption layer 134 includes a first portion arranged between the common layer 156 and the light-emitting layer 132G, or a second portion arranged between the light-emitting layer 132B and the light-emitting layer 132G. In the carrier absorption layer 134, the first portion and the second portion have a contiguous shape.

In addition, the first portion of the carrier absorption layer 134 may be arranged so as to be close to the light-emitting area (the opening 120G) of the light-emitting element 130G. The distance from the end portion of the opening 120B to the end portion of the opening 120G is d1. In this case, the end portion of the opening 120B refers to a part in contact with the pixel electrode 124B. In addition, the end portion of the opening 120G refers to a part in contact with the pixel electrode 124G. The first portion 134-1 of the carrier absorption layer 134 is arranged on a side closer to the opening 120G than the intermediate part d1/2 between the end portion of the opening 120G and the end portion of the opening 120B.

In addition, the carrier absorption layer 134 is arranged at the position where the end portion of the light-emitting layer 132B overlaps the end portion of the light-emitting layer 132R. Specifically, the carrier absorption layer 134 includes a first portion arranged between the common layer 156 and the light-emitting layer 132R, or a second portion arranged between the light-emitting layer 132B and the light-emitting layer 132R. In the carrier absorption layer 134, the first portion and the second portion have a contiguous shape.

The first portion of the carrier absorption layer 134 is arranged so as to be close to the light-emitting area (the opening 120R) of the light-emitting element 130R. The distance from the end portion of the opening 120B to the end portion of the opening 120R is d2. In this case, the end portion of the opening 120R refers to a part in contact with the pixel electrode 124R. The first portion of the carrier absorption layer 134 is arranged on a side closer to the opening 120R than the intermediate part d2/2 between the end portion of the opening 120G and the end portion of the opening 120B.

In the light-emitting element 130 of the display device 100F, the pixel electrode 142 is used as a cathode and the counter electrode 158 is used as an anode. Even in this case, similar to the display device 100, at the end portion of the light-emitting layer 132B, the carrier absorption layer 134 can absorb the electrons by arranging the end portion of the light-emitting layer 132B separately from the end portions of the light-emitting layers 132R and 132G where unintended light emission is likely to occur by the carrier absorption layer 134, thereby preventing the electrons from moving in the thickness direction of the light-emitting layer 132B or the transverse direction. Therefore, the strength of the leakage current in the transverse direction from the light-emitting element 130B can be reduced at the end portion of the light-emitting layer 132B. As a result, it is possible to suppress the occurrence of unintended light emission in the light-emitting layer 132R or the light-emitting layer 132G.

The light-emitting layer 132B in contact with the common layer 156 including at least one of the electron-transport layer and the electron injection layer preferably includes a hole-transporting light-emitting material. When the light-emitting element 130B emits light, it is possible to prevent the electrons in the common layer 148 from passing through the light-emitting layer 132B in the thickness. The electrons pass through the end portion of the light-emitting layer 132B in the transverse direction, so that the strength of the leakage current in the transverse direction can be further reduced. As a result, it is possible to suppress the occurrence of unintended light emission in the light-emitting layer 132R or the light-emitting layer 132G.

Also, in Modification 6, the carrier absorption layer 134A described above can be arranged in place of the carrier absorption layer 134. In the case of manufacturing the display device 100F having the carrier absorption layer 134A, the carrier absorption layer 134A is arranged above the common layer 156, and the end portion of the light-emitting layer 132B is formed at the position corresponding to the second portion of the carrier absorption layer 134. In the later process, the end portions of the light-emitting layers 132R and 132G may be formed so as to cover the position corresponding to the first portion of the carrier absorption layer 134A and overlap the second portion of the carrier absorption layer 134 and the end portion of the light-emitting layer 132B.

In addition, the configuration of the display device 100F according to Modification 6 can be applied to the configuration according to the display devices 100A to 100E according to Modifications 1 to 5. In other words, in the display devices 100A to 100E according to Modifications 1 to 5, the pixel electrode 124 may be used as a cathode, and the counter electrode 138 may be used as an anode. In this case, the common layer arranged between the pixel electrode 124 and the light-emitting layer 132 includes at least one of the electron-transport layer and the electron injection layer. In addition, the common layer arranged between the counter electrode 138 and the light-emitting layer includes at least one of the hole-transport layer and the hole injection layer. The light-emitting layer having the highest light emission start voltage among the light-emitting layers 132R, 132G, and 132B is preferably arranged above the common layer 128 including the electron-transport layer and the electron injection layer. The light-emitting layer is preferably a light-emitting material having a hole-transport property.

As described above, the display device according to an embodiment of the present invention can be applied to various forms. Therefore, the addition, deletion, or design change of components, or the addition, deletion, or condition change of processes as appropriate by those skilled in the art based on the display devices 100, 100A to 100F described as the embodiments and modifications of the present invention are also included in the scope of the present invention as long as they are provided with the gist of the present invention. Further, each of the embodiments described above as an embodiment of the present invention can be appropriately combined and implemented as long as no contradiction is caused.

Although the above-described embodiment mainly describes the display device having the organic EL element as a display element that suppresses a leakage current in the organic layer, the present invention is applicable not only to a display device but also to an optical sensor device or the like configured by arranging an organic photodiode in which an organic layer is sandwiched between electrodes in a matrix. More specifically, the present invention can be applied to an overlapping relationship of the end portions of the organic layers that are separately formed among the organic layer constituting the organic photodiode.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising:
   a first pixel electrode;
   a second pixel electrode arranged separately from the first pixel electrode in a first direction;
   an insulating layer covering the first pixel electrode and the second pixel electrode, the insulating layer including a first opening part and a second opening part, the first opening part exposing at least a part of an upper surface of the first pixel electrode, and the second opening part exposing at least a part of an upper surface of the second pixel electrode;
   a first common layer arranged above the first pixel electrode, the second pixel electrode and the insulating layer;
   a first light-emitting layer arranged above the first common layer, the first light-emitting layer being arranged at a position overlapping the first pixel electrode;
   a second light-emitting layer arranged above the first common layer, the second light-emitting layer being arranged at a position overlapping the second pixel electrode;
   an opposite electrode arranged above the first light-emitting layer and the second light-emitting layer; and
   a carrier absorption layer arranged above the insulating layer, the carrier absorption layer being arranged between the first common layer and the second light-emitting layer,
   wherein a light emission start voltage of the second light-emitting layer is lower than a light emission start voltage of the first light-emitting layer.

2. The display device according to claim 1, wherein the carrier absorption layer includes a first portion arranged between the first common layer and the second light-emitting layer, and a second portion arranged between the first light-emitting layer and the second light-emitting layer.

3. The display device according to claim 2, wherein the carrier absorption layer is arranged closer to the second opening part than the first opening part.

4. The display device according to claim 1, wherein the first light-emitting layer has an electron transport property, and the first common layer has a hole transport property when the first pixel electrode and the second pixel electrode are anodes.

5. The display device according to claim 4, wherein the carrier absorption layer includes an electron transport material.

6. The display device according to claim 1, wherein the first light-emitting layer has a hole transport property and the first common layer has an electron transport property when the first pixel electrode and the second pixel electrode are cathodes.

7. The display device according to claim 6, wherein the carrier absorption layer includes a hole transport material.

8. The display device according to claim 1, wherein an emission peak wavelength of the first light-emitting layer is 460 nm or more and 500 nm or less.

9. The display device according to claim 1, wherein an emission peak wavelength of the first light-emitting layer is 610 nm or more and 780 nm or less.

10. The display device according to claim 1, wherein an emission peak wavelength of the first light-emitting layer is 500 nm or more and 570 nm or less.

* * * * *